(12) United States Patent
Katou

(10) Patent No.: US 8,089,803 B2
(45) Date of Patent: Jan. 3, 2012

(54) MAGNETIC RANDOM ACCESS MEMORY AND OPERATING METHOD OF THE SAME

(75) Inventor: Yuukou Katou, Tokyo (JP)

(73) Assignee: NEC Corporation, Tokyo (JP)

( * ) Notice: Subject to any disclaimer, the term of this patent is extended or adjusted under 35 U.S.C. 154(b) by 469 days.

(21) Appl. No.: 12/083,001

(22) PCT Filed: Oct. 2, 2006

(86) PCT No.: PCT/JP2006/319666
§ 371 (c)(1),
(2), (4) Date: May 29, 2008

(87) PCT Pub. No.: WO2007/040189
PCT Pub. Date: Apr. 12, 2007

(65) Prior Publication Data
US 2009/0154231 A1   Jun. 18, 2009

(30) Foreign Application Priority Data
Oct. 3, 2005 (JP) ................. 2005-290228

(51) Int. Cl.
*G11C 11/15* (2006.01)

(52) U.S. Cl. ........ 365/173; 365/158; 365/171; 257/421; 257/422

(58) Field of Classification Search .............. 365/158, 365/171, 173; 257/421, 422
See application file for complete search history.

(56) References Cited

U.S. PATENT DOCUMENTS

| 6,111,783 | A | 8/2000 | Tran et al. | |
|---|---|---|---|---|
| 6,404,674 | B1 | 6/2002 | Anthony et al. | |
| 6,545,906 | B1 | 4/2003 | Savtchenko et al. | |
| 6,958,927 | B1 * | 10/2005 | Nguyen et al. | 365/158 |
| 7,057,921 | B2 * | 6/2006 | Valet | 365/158 |
| 7,119,410 | B2 | 10/2006 | Saito et al. | |
| 7,164,598 | B2 * | 1/2007 | Jeong et al. | 365/158 |
| 7,190,613 | B2 * | 3/2007 | Nagase et al. | 365/171 |

(Continued)

FOREIGN PATENT DOCUMENTS
JP   2002-140889   5/2002
(Continued)

OTHER PUBLICATIONS
U.S. Office Action dated Dec. 17, 2009 in U.S. Appl. No. 11/996,073.
(Continued)

*Primary Examiner* — Tuan Nguyen
*Assistant Examiner* — Lance Reidlinger
(74) *Attorney, Agent, or Firm* — McGinn IP Law Group, PLLC

(57) ABSTRACT

A magnetic random access memory of a spin transfer process, includes a plurality of magnetic memory cells 10, a current supply unit 43+20+30 and a control unit 41. The current supply unit 43+20+30 supplies a write current to the magnetic memory cell 10. The control unit controls a supply of the write current supplied by the current supply unit 43+20+30 on the basis of a write data. Each magnetic memory cell 10 includes a magnetic material storage layer which stores a data by using a magnetization state, and at least one spin control layer which supplies spin electrons to the magnetic material storage layer on the basis of a same control principle independently of the write data, on the basis of the write current.

10 Claims, 11 Drawing Sheets

U.S. PATENT DOCUMENTS

| | | |
|---|---|---|
| 7,239,568 B2 | 7/2007 | Perner et al. |
| 2003/0218902 A1 | 11/2003 | Perner et al. |
| 2003/0218905 A1 | 11/2003 | Perner et al. |
| 2004/0088471 A1 | 5/2004 | Perner et al. |
| 2004/0090841 A1 | 5/2004 | Perner et al. |
| 2004/0114444 A1 | 6/2004 | Matsuoka |
| 2004/0130936 A1* | 7/2004 | Nguyen et al. ............... 365/158 |
| 2005/0057960 A1 | 3/2005 | Saito et al. |
| 2005/0157538 A1 | 7/2005 | Moriyama et al. |
| 2006/0013038 A1 | 1/2006 | Kaiyang et al. |
| 2006/0139818 A1* | 6/2006 | Inaba et al. ............. 360/324.12 |
| 2006/0250865 A1 | 11/2006 | Yang et al. |
| 2007/0007610 A1 | 1/2007 | Saito et al. |

FOREIGN PATENT DOCUMENTS

| | | |
|---|---|---|
| JP | 2003-7985 | 1/2003 |
| JP | 2003-115577 | 4/2003 |
| JP | 2003-272375 | 9/2003 |
| JP | 2003-346475 | 12/2003 |
| JP | 2004-5972 | 1/2004 |
| JP | 2004-193346 | 7/2004 |
| JP | 2004-234707 | 8/2004 |
| JP | 2005-50424 | 2/2005 |
| JP | 2005-50907 | 2/2005 |
| JP | 2005-150482 | 6/2005 |
| JP | 2005-166896 | 6/2005 |
| JP | 2005-175374 | 6/2005 |
| JP | 2005-203443 | 7/2005 |
| JP | 2006-31923 | 2/2006 |
| WO | WO 2007/015358 A1 | 2/2007 |

OTHER PUBLICATIONS

K. Yagami, et al. "Research Trends in Spin Transfer Magnetization Switching", vol. 28, No. 9, 2004.

Scheuerlein, et al., "A 10ns Read and Write Non-Volatile Memory Array Using a Magnetic Tunnel Junction and FET Switch in each Cell", 2000 IEEE International Solid-State Circuits Conference Digest of Technical Papers, p. 128.

Durlam, et al., "Nonvolatile RAM based on Magnetic Tunnel Junction Elements", 2000 IEEE International Solid-State Circuits Conference Digest of Technical Papers, p. 130.

Grollier, et al., "Spin-polarized current induced switchin Co/Cu/Co pillars", Applied Physics Letters, vol. 78, pp. 3663, 2001.

* cited by examiner

VOLTAGE OF
SELECTION LINE 31

VOLTAGE OF
FIRST WRITE LINE 21

CURRENT $I_{M1}$ OF
SECOND WRITE LINE 71

VOLTAGE OF
SELECTION LINE 31

VOLTAGE OF
FIRST WRITE LINE 21

CURRENT $I_{M1}$ OF
SECOND WRITE LINE 71

CURRENT $I_{M2}$ OF
THIRD WRITE LINE 81

MAGNETIC RANDOM ACCESS MEMORY AND OPERATING METHOD OF THE SAME

TECHNICAL FIELD

The present invention relates to a magnetic random access memory and an operating method of the same, and more particularly relates to a magnetic random access memory that uses a spin transfer process and an operating method of the same.

BACKGROUND ART

A magnetic random access memory (hereafter, also referred to as a MRAM) is known, which uses a magneto-resistive element as a storage element. As the magneto-resistive element, an element is known, which indicates a magnetic resistive effect such as an AMR (Anisotropic Magneto-Resistance) effect, a GMR (Giant Magnet-Resistance) effect and a TMR (Tunnel Magneto-Resistance) effect.

A TMR structure and a magnetic random access memory using the same as a storage element are disclosed in, for example, 2000 IEEE International Solid-State Circuits Conference DIGEST OF TECHNICAL PAPERS, P.128, and 2000 IEEE International Solid-State Circuits Conference DIGEST OF TECHNICAL PAPERS, P.130. Also, U.S. Pat. No. 6,545,906 discloses a toggle write mode as one of data writing methods in a MRAM.

In those data wiring methods to the MRAM, an inversion magnetic field required to switching a magnetization of a free layer becomes greater, approximately inversely proportional to a size of a memory cell. In short, as the memory cell is made miniaturized, a write current tends to be increased.

As a writing method which can suppress an increase in a write current in association with miniaturization, a spin transfer process is disclosed in, for example, Grollier et al., "Spin-polarized current induced switching in Co/Cu/Co pillars", Applied Physics Letters, Vol. 78, pp. 3663, 2001. This spin transfer process uses a magneto-resistive element having a structure in which two Co-magnetic material films whose thicknesses are different are laminated through a Cu layer. When a current is supplied by applying a voltage to this magneto-resistive element in a lamination direction, a resistance value between the magnetic materials can be changed on the basis of a polarity of the current. A data storing is carried out by correlating a data to the resistance value.

As a principle of the spin transfer process, when electrons are supplied from the thick magnetic material side, a magnetization direction of the thin magnetic material becomes the same magnetization direction as the thick magnetic material. That is, the magnetizations become parallel. This is because spin electrons, on which the magnetization direction of the thick magnetic material is reflected, are transferred to the thin magnetic material. On the other hand, when electrons are supplied from the thin magnetic material side, the magnetization direction of the thin magnetic material becomes opposite to the magnetization direction of the thick magnetic material. That is, the magnetizations are anti-parallel. This is because, when electrons are supplied from the thin magnetic material side, spin electrons of which magnetization direction does not coincide with that of the thick magnetic material remains in the thin magnetic material.

FIG. 1 is a schematic view showing situations of magnetization switching in a spin transfer process. A magneto-resistive element 101 includes a free layer 102 and a pinned layer 104 which are magnetic layers, and a tunnel barrier layer 103 of a non-magnetic layer which is sandwiched between the free layer 102 and the pinned layer 104. Here, the pinned layer 104 whose magnetization direction is fixed is formed to be thicker than the free layer 102. The state in which the magnetization directions of the free layer 102 and the pinned layer 104 are parallel is correlated to a data "0", and the state in which they are anti-parallel is correlated to the data "1".

The magnetization switching in the spin transfer process is attained by a CPP (Current Perpendicular to Plane) process, and a write current IW is supplied vertically to a material surface. Specifically, at a time of a shift to a data "0" from a data "1", the write current IW is transferred from the free layer 102 to the pinned layer 104. In this case, electrons e-having the same spin state as that in the pinned layer 104 is inversely moved to the free layer 102 from the pinned layer 104. The spin electrons, on which the magnetization direction of the thick pinned layer 104 is reflected, is considered to be transferred to the thin free layer 102. Thus, the magnetization of the free layer 102 is switched and becomes the same magnetization direction of the pinned layer 104 (becomes "0").

At a time of a shift to the data "1" from the data "0", the write current IW is supplied from the pinned layer 104 to the free layer 102. In this case, electrons e-having the same spin state as that in the pinned layer 104 is inversely moved from the free layer 102 to the pinned layer 104. When electrons is supplied from the thin free layer 102, spin electrons, of which states do not coincide with the magnetization direction of the thick pinned layer 104, remains in the free layer 102. Thus, the magnetization of the free layer 102 is switched and becomes the same magnetization direction of the pinned layer 104 (becomes "1").

In this way, in the magnetization switching of the spin transfer process, a data is written by movement of spin electrons. The magnetization direction of the free layer 102 can be defined on the basis of the direction of the write current IW transferred vertically to the material surface. Here, it is known that a threshold of writing (the magnetization switching) depends on a current density. Thus, as a size of a memory cell is miniaturized, the write current necessary for the magnetization switching is decreased. That is, since the write current IW is decreased based on miniaturizing a structure of the memory cell, the magnetization switching of the spin transfer process is important to attain a large capacity of the MRAM. However, as for the magnetization switching based on the spin transfer process as mentioned above, principles are considered to be different between cases of switching directions ("1" to "0" and "0" to "1"). Thus, write properties are different on the basis of the switching directions, and a control of the writing is complicated.

As a related technique, Japanese Laid-Open Patent Application (JP-P 2004-193346A) discloses a magnetic memory and a magnetic memory manufacturing method. This magnetic memory includes a substrate; a first insulating film, a plurality of first signal lines, a plurality of memory cells, a first inter-layer insulating film, a second insulating film formed on the first inter-layer insulating film, and a plurality of second signal lines. The first insulating film is formed on the top surface side of the substrate. The plurality of first signal lines is embedded in the first insulating film and formed to extend to a first direction. Each of the plurality of memory cells is formed on each of the plurality of first signal lines and includes a magneto-resistive element having a spontaneous magnetization in which a magnetization direction is switched on the basis of a stored data. The first inter-layer insulating film is formed to surround the plurality of memory cells, on the first insulating film and the plurality of first signal lines. The second insulating film is formed on the first inter-layer insulating film. The plurality of second signal lines is embedded in the second insulating film and formed to extend to a second direction substantially vertical to the first direction. At least one of the first insulating film and the second insulating film includes a magnetic material of high magnetic permeability. Each of the plurality of memory cells is arranged at each of positions at which the plurality of first signal lines and the plurality of second signal lines intersect.

Japanese Laid-Open Patent Application (JP-P 2005-50907A) discloses a magnetic resistive effect element and a magnetic memory. This magnetic resistive effect element includes a first magnetization pinned layer, a second magnetization pinned layer, a magnetic recording layer, a tunnel barrier layer and a middle layer. The first magnetization pinned layer has a magnetic layer of at least one layer, and a spin direction is pinned. The second magnetization pinned layer has a magnetic layer of at least one layer, and a spin direction is pinned. The magnetic recording layer has a magnetic layer of at least one layer formed between the first magnetization pinned layer and the second magnetization pinned layer, and a spin direction is variable. The tunnel barrier layer is formed between the first magnetization pinned layer and the magnetic recording layer. The middle layer is formed between the magnetic recording layer and the second magnetization pinned layer.

Japanese Laid-Open Patent Application (JP-P 2005-150482A) discloses a magnetic resistive effect element and a magnetic memory. This magnetic resistive effect element includes a magnetization free layer, and a first magnetic layer and a second magnetic layer, which are formed on both sides of this magnetization free layer and magnetically separated from each other, and magnetization directions of the magnetic layers are pinned oppositely to each other. A magnetic moment number per unit area in the first magnetic layer and the second magnetic layer may be greater than that of the magnetization free layer.

Japanese Laid-Open Patent Application (JP-P 2005-166896A) discloses a magnetic resistive effect element and a first wiring layer. The magnetic resistive effect element includes a magnetization pinned layer whose magnetization direction is pinned, a storage layer whose magnetization direction is variable, and a tunnel barrier layer formed between the magnetization pinned layer and the storage layer. The first wiring layer is electrically connected to the magnetic resistive effect element and extends to a direction orthogonal to a magnetization easy axis direction of the storage layer. The end surface of the magnetic resistive effect element orthogonal to the magnetization easy axis direction and the end surface of the first wiring layer orthogonal to the magnetization easy axis direction are located on the same flat surface.

Japanese Laid-Open Patent Application (JP-P 2005-175374A) discloses a magnetic memory device and a manufacturing method of the same. This magnetic memory device includes a first magnetic material layer, a tunnel magneto-resistive element, a first conductive wiring and a second conductive wiring. The first magnetic material layer is a magnetization pinned layer. The tunnel magneto-resistive element is formed such that a tunnel barrier layer is sandwiched between the tunnel magneto-resistive element and a second magnetic material layer as a magnetization free layer whose magnetization direction can be changed. A spin direction of the second magnetic material layer is parallel or anti-parallel to a spin direction of the first magnetic material layer. Correspondingly thereto, information is stored. The first conductive wiring is electrically insulated from the tunnel magneto-resistive element. The second conductive wiring crosses this first conductive wiring and is electrically connected to the tunnel magneto-resistive element. With regard to a pair of end sides of the second magnetic material layer and a pair of end sides of the first magnetic material layer, which exist in a direction of a magnetic moment of the second magnetic material layer, a distance between one end side of the second magnetic material layer and one end side of the first magnetic material layer located on the same side as the foregoing end side is substantially equal to a distance between the other end side of the second magnetic material layer and the other end side of the first magnetic material layer located on the same side as the foregoing end side.

DISCLOSURE OF INVENTION

An object of the present invention is to provide a magnetic random access memory and operating method of the same, in which a write property is similar, independently of a magnetization direction when writing of a spin transfer process is executed.

Another object of the present invention is to provide a magnetic random access memory and operating method of the same, in which writing can be executed by a similar circuit, independently of a stored data when the writing of a spin transfer process is executed.

Still another object of the present invention is to provide a magnetic random access memory and operating method of the same, in which writing can be executed by a similar method, independently of a stored data when the writing of a spin transfer process is executed.

This and other objects, features and advantages of the present invention will be readily ascertained by referring to the following description and drawings.

In order to achieve an aspect of the present invention, a magnetic random access memory of the present invention is a magnetic random access memory of a spin transfer process. The magnetic random access memory includes a plurality of magnetic memory cells, a current supply unit and a control unit. The current supply unit selects a target memory cell to which a data is written from the plurality of magnetic memory cells, and supplies a write current to the target memory cell. The control unit controls a supply of the write current supplied by the current supply unit on the basis of a write data. Each of the plurality of magnetic memory cells includes: a magnetic material storage layer which stores a data on by using a magnetization state; and at least one spin control layer which supplies spin electrons to the magnetic material storage layer on the basis of the same control principle independently of a write data, on the basis of the write current.

In the magnetic random access memory, at least one spin control layer is one. The control unit controls states of spin electrons in the spin control layer, on the basis of the write data.

In the magnetic random access memory, the magnetic material storage layer includes a first magnetic material layer and a second magnetic material layer which is antiferromagnetically-coupled with the first magnetic material layer through a non-magnetic conductor layer.

In the magnetic random access memory, the magnetic material storage layer includes a first magnetic material layer and a second magnetic material layer which is antiferromagnetically-coupled with the first magnetic material layer through a non-magnetic conductor layer. At least one spin control layer includes a first spin control layer and a second spin control layer. The first spin control layer includes a first magnetic material pinned layer whose magnetization direction is pinned and which is coupled with the first magnetic material layer through a first non-magnetic material layer.

The second spin control layer includes a second magnetic material pinned layer whose magnetization direction is pinned and which is coupled with the second magnetic material layer through a second non-magnetic material layer. The magnetization directions of the first magnetic material pinned layer and the second magnetic material pinned layer are approximately coincident. The control unit controls the current supply unit so that the write current is supplied from any one of the first magnetic material pinned layer and the second magnetic material pinned layer to the other one, on the basis of the write data.

In the magnetic random access memory, at least one of the first magnetic material pinned layer and the second magnetic material pinned layer includes a third magnetic material layer and a fourth magnetic material layer which is antiferromagnetically-coupled with the third magnetic material layer through a non-magnetic conductor.

In the magnetic random access memory, the magnetic material storage layer includes a first magnetic material layer and a second magnetic material layer which is antiferromagnetically-coupled with the first magnetic material layer through a non-magnetic conductor layer. The spin control layer includes a first magnetic material reference layer that is coupled with the first magnetic material layer through a first non-magnetic material layer. The control unit changes a magnetization direction of the first magnetic material reference layer based on the write data, and controls the current supply unit so that the write current is supplied from any one of the first magnetic material reference layer and the second magnetic material layer to the other one in a predetermined direction.

In the magnetic random access memory, the spin control layer further includes a second magnetic material reference layer that is antiferromagnetically-coupled with the first magnetic material reference layer through a second non-magnetic material layer, between the first non-magnetic material layer and the first magnetic material reference layer. The control unit, while continuously changing the magnetization direction of the first magnetic material reference layer with a temporal elapse, controls the current supply unit so that the write current is supplied from any one of the first magnetic material reference layer and the second magnetic material layer to the other one in a predetermined direction, on the basis of the write data.

In the magnetic random access memory, the control unit includes a magnetization direction setting unit which controls the magnetization direction of the first magnetic material reference layer in the spin control layer on the basis of the write data.

In the magnetic random access memory, the magnetization direction setting unit includes a wiring extending near the target memory cell. The control unit controls the magnetization direction of the first magnetic material reference layer by using a magnetic field generated by a current flowing through the wiring.

In the magnetic random access memory, the spin control layer is shaped such that a section vertical to a direction through which the write current flows is externally configured by any of convex curves and straight lines.

In the magnetic random access memory, a shape of the spin control layer is one of a circle, a square and a shape similar to any one of a circle and a square.

In order to achieve another aspect of the present invention, the present invention is an operating method of a magnetic random access memory of a spin transfer process. Here, the magnetic random access memory includes a plurality of magnetic memory cells, a current supply unit and a control unit. Each of the plurality of magnetic memory cells includes a magnetic material storage layer which stores a data by using a magnetization state, and at least one spin control layer. The operating method of the magnetic random access memory includes (a) the current supply unit selecting a target memory cell to which a data is written from the plurality of magnetic memory cells; (b) the control unit controlling the current supply unit on the basis of the write data such that the current supply unit supplies a write current to the target memory cell; and (c) at least one spin control layer supplying spin electrons to the magnetic material storage layer on the basis of the same control principle, independently of the write data, on the basis of the write current.

In the operating method of the magnetic random access memory, at least one spin control layer is one. The step (b) includes (b1) the control unit controlling states of spin electrons in the spin control layer, on the basis of the write data.

In the operating method of the magnetic random access memory, the magnetic material storage layer includes a first magnetic material layer and a second magnetic material layer which is antiferromagnetically-coupled with the first magnetic material layer through a non-magnetic conductor layer.

In the operating method of the magnetic random access memory, the magnetic material storage layer includes a first magnetic material layer and a second magnetic material layer which is antiferromagnetically-coupled with the first magnetic material layer through a non-magnetic conductor layer. At least one spin control layer includes a first spin control layer and a second spin control layer. The first spin control layer includes a first magnetic material pinned layer whose magnetization direction is pinned and which is coupled with the first magnetic material layer through a first non-magnetic material layer. The second spin control layer includes a second magnetic material pinned layer whose magnetization direction is pinned and which is coupled with the second magnetic material layer through a second non-magnetic material layer. The magnetization directions of the first magnetic material pinned layer and the second magnetic material pinned layer are substantially coincident. The step (b) includes (b2) the control unit controlling the current supply unit so that the write current is supplied from any one of the first magnetic material pinned layer and the second magnetic material pinned layer to the other one, on the basis of the write data.

In the operating method of the magnetic random access memory, at least one of the first magnetic material pinned layer and the second magnetic material pinned layer includes a third magnetic material layer and a fourth magnetic material layer which is antiferromagnetically-coupled with the third magnetic material layer through a non-magnetic conductor.

In the operating method of the magnetic random access memory, the magnetic material storage layer includes a first magnetic material layer and a second magnetic material layer which is antiferromagnetically-coupled with the first magnetic material layer through a non-magnetic conductor layer. The spin control layer includes a first magnetic material reference layer that is coupled with the first magnetic material layer through a first non-magnetic material layer. The step (b1) includes (b11) the control unit changing a magnetization direction of the first magnetic material reference layer on the basis of the write data, and controlling the current supply unit so that the write current is supplied from any one of the first magnetic material reference layer and the second magnetic material layer to the other one in a predetermined direction.

In the operating method of the magnetic random access memory, the spin control layer further includes a second magnetic material reference layer that is antiferromagnetically-coupled with the first magnetic material reference layer through a second non-magnetic material layer, between the first non-magnetic material layer and the first magnetic material reference layer. The step (b1) further includes (b12) the control unit, while continuously changing the magnetization direction of the first magnetic material reference layer with a temporal elapse, controlling the current supply unit so that the write current is supplied from any one of the first magnetic material reference layer and the second magnetic material layer to the other one in a predetermined direction, on the basis of the write data.

In the operating method of the magnetic random access memory, the control unit includes a magnetization direction setting unit which controls the magnetization direction of the first magnetic material reference layer in the spin control layer on the basis of the write data.

In the operating method of the magnetic random access memory, the magnetization direction setting unit includes a wiring extending near the target memory cell. The step (b1) further includes (b13) the control unit controlling the magnetization direction of the first magnetic material reference layer by using a magnetic field generated by a current flowing through the wiring.

In the operating method of the magnetic random access memory, the spin control layer is shaped such that a section vertical to a direction through which the write current flows is externally configured by any of convex curves and straight lines.

In the operating method of the magnetic random access memory, a shape of the spin control layer is one of a circle, a square and a shape similar to any one of a circle and a square.

BEST MODE FOR CARRYING OUT THE INVENTION

Exemplary embodiments of a magnetic random access memory and an operating method of the same according to the present invention will be described below with reference to the attached drawings.

First Exemplary Embodiment

A first exemplary embodiment of the magnetic random access memory and the operating method of the same according to the present invention will be described below with reference to the attached drawings. At first, a configuration of the magnetic random access memory in the first exemplary embodiment of the present invention will be described.

Figure 2:
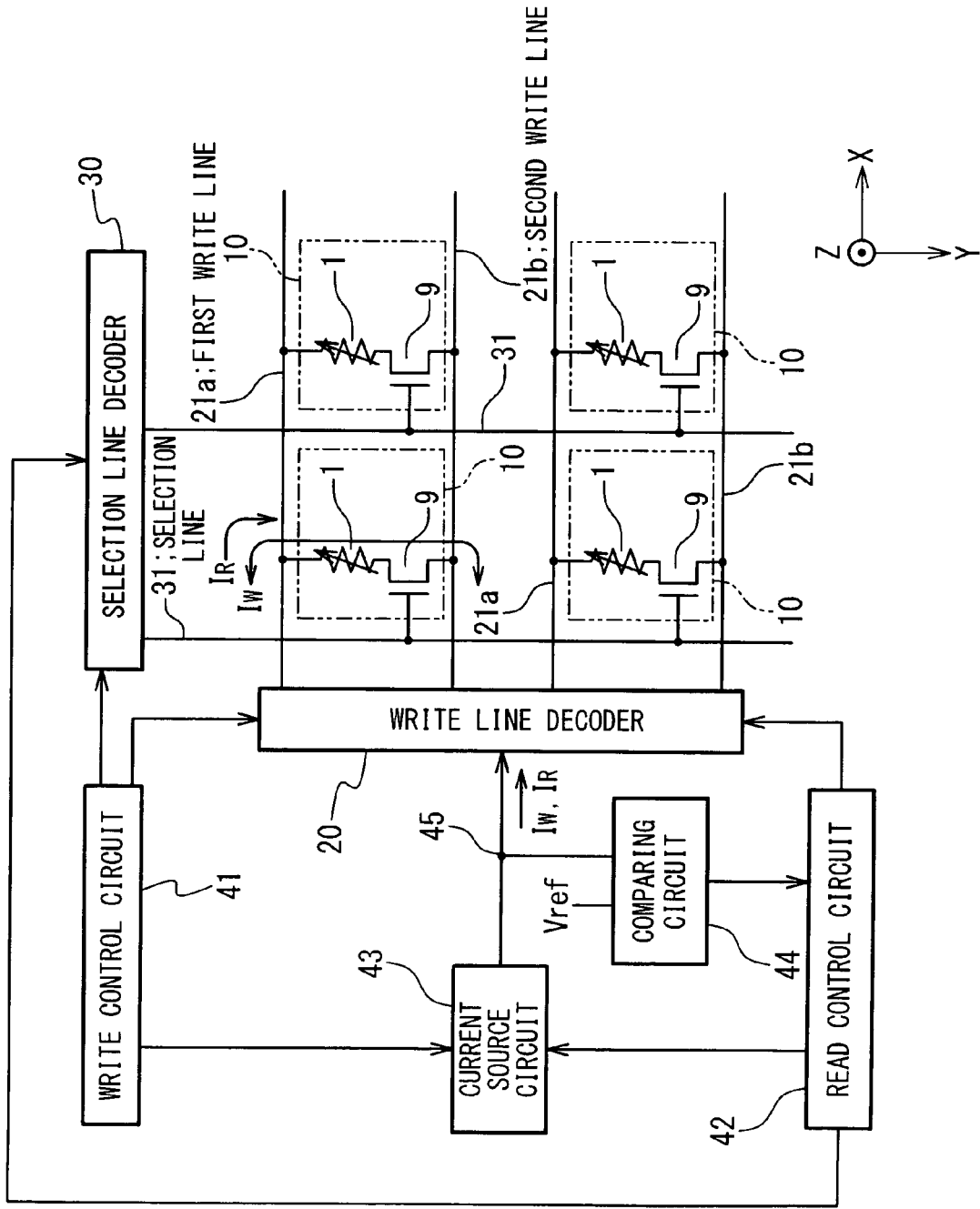
FIG. 2 is a block diagram showing a configuration of a magnetic random access memory in a first exemplary embodiment of the present invention.

FIG. 2 is a block diagram showing a configuration of the magnetic random access memory in the first exemplary embodiment of the present invention. The magnetic random access memory includes a plurality of memory cells 10, a write line decoder 20, a plurality of first write lines 21a, a plurality of first write lines 21b, a selection line decoder 30, a plurality of selection lines 31, a write control circuit 41, a read control circuit 42, a current source circuit 43 and a comparing circuit 44.

The plurality of memory cells 10 is arranged in the shape of a matrix inside a MRAM and constitutes a memory cell array. The memory cell 10 stores a data by using a magneto-resistive effect. The memory cell 10 includes a magneto-resistive element 1 and a selecting transistor 9. The magneto-resistive element 1 has a structure that will be described later (FIG. 3) and is sandwiched between an upper electrode and a lower electrode. One end of the magneto-resistive element 1 is connected through the upper electrode to the first write line 21a, and the other end is connected through the lower electrode to one of source/drain of the selecting transistor 9. The other of the source/drain of the selecting transistor 9 is connected to the first write line 21b. A gate of the selecting transistor 9 is connected to the selection line 31. The plurality of first write lines 21a and the plurality of first write lines 21b, each one thereof end is connected to the write line decoder 20, are extended to an X-direction (first direction). The plurality of selection lines 31, each one end thereof is connected to the selection line decoder 30, is extended to a Y-direction (second direction) substantially vertical to the X-direction (first direction).

The write control circuit 41 controls an operation of each circuit by sending a control signal to each circuit. That is, the write control circuit 41 outputs a write control signal, which adjusts a write current IW, to the current source circuit 43. The write control circuit 41 outputs a selection line address signal related to an address of a target memory cell 10, to the selection line decoder (selection line driver) 30. The write control circuit 41 outputs a current direction signal indicating a direction of the write current IW and a write line address signal related to the address of the target memory cell 10, to the write line decoder (write line driver) 20. The direction of the write current IW is determined on the basis of a data written to the target memory cell 10.

The current source circuit 43 supplies the write current IW through the write line decoder 20 to the memory cell 10. The current source circuit 43 supplies, changes and stops the write current IW, in response to the write control signal from the write control circuit 41.

The selection line decoder 30 selects one selection line 31 linked to the target memory cell 10, in response to the selection line address signal from the write control circuit 41. Thus, the selecting transistor 9 in the memory cell 10 is turned ON.

The write line decoder 20 selects the first write line 21a and the first write line 21b, which are linked to the target memory cell 10, in response to the write line address signal from the write control circuit 41. Then, the write line decoder 20 supplies the write current IW outputted from the current source circuit 43 to the memory cell 10 (magneto-resistive element 1) so that a direction of the current coincides with a direction indicated by the current direction signal, in response to the current direction signal from the write control circuit 41. At that time, one first write line is connected to the current source circuit 43, and the other first write line is grounded.

The read control circuit 42 controls an operation of each circuit by sending a control signal to each circuit. That is, the read control circuit 42 outputs a read control signal, which adjusts a read current IR, to the current source circuit 43. The read control circuit 42 outputs a selection line address signal related to an address of a target memory cell 10, to the selection line decoder 30. The read control circuit 42 outputs a write line address signal related to the address of the target memory cell 10 and a read signal indicating a reading operation, to the write line decoder 20. A direction of the read current IR is a direction to the first write line 21b from the first write line 21a.

The current source circuit 43 further supplies the read current IR through the write line decoder 20 to the memory cell 10. The current source circuit 43 supplies, changes and stops the read current IR, in response to the read control signal from the read control circuit 42.

The selection line decoder 30 further selects one selection line 31 linked to the target memory cell 10, in response to the selection line address signal from the read control circuit 42. Thus, the selecting transistor 9 in the target memory cell 10 is turned ON.

The write line decoder 20 further selects the first write line 21a and the first write line 21b, which are linked to the target memory cell 10, in response to the write line address signal and the read signal from the read control circuit 42. Then, the write line decoder 20 supplies the read current IR outputted by the current source circuit 43 to the memory cell 10 (magneto-resistive element 1) so that the current is supplied from the first write line 21a to the first write line 21b. At that time, one first write line is connected to the current source circuit 43, and the other first write line is grounded.

The comparing circuit 44 detects a resistance value of the magneto-resistive element 1 in the target memory cell 10 and judges a data written in the target memory cell 10. Then, the judgment result is outputted to the read control circuit 42. In order to detect the resistance value of the magneto-resistive element 1, for example, a potential at a predetermined position on the line through which the write current IW flows may be used. Here, as an example, a potential V45 at a node 45 placed between the current source circuit 43 and the write line decoder 20 is used. When the read current IR is constant, as the resistance value of the magneto-resistive element 1 is larger, the potential V45 is higher, and as the resistance value is smaller, the potential V45 is lower. In short, the potential V45 reflects the resistance value of the magneto-resistive element 1. The comparing circuit 44 judges the data written in the target memory cell 10, based on the potential V45.

Specifically, the comparing circuit 44 compares the potential V45 with a reference potential Vref. The reference potential Vref is set to a middle potential between a potential V45 corresponding to the data "0" and a potential V45 corresponding to the data "1". Thus, the comparing circuit 44 can judge the data written in the target memory cell 10 by comparing the potential V45 and the reference potential Vref.

Figure 3:
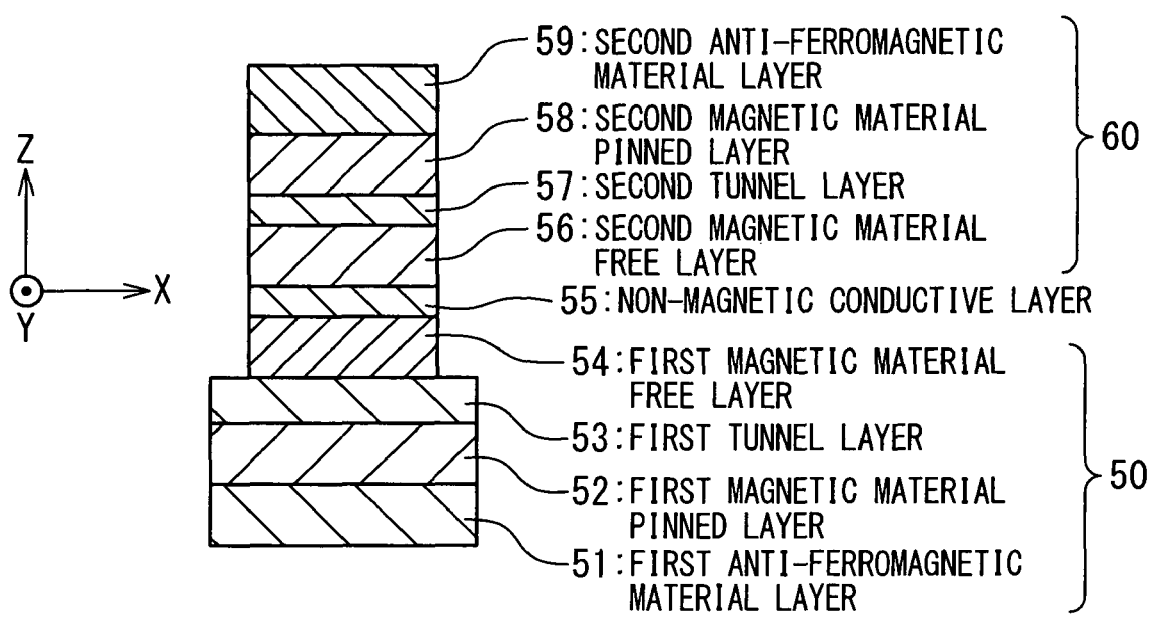
FIG. 3 is a sectional view showing a structure of a magneto-resistive element of the magnetic random access memory in the first exemplary embodiment of the present invention.

FIG. 3 is a sectional view showing a structure of the magneto-resistive element of the magnetic random access memory in the first exemplary embodiment of the present invention. The magneto-resistive element 1 includes a first magnetic material lamination unit 50, a non-magnetic conductor layer 55 and a second magnetic material lamination unit 60. In the first magnetic material lamination unit 50, a first anti-ferromagnetic material layer 51, a first magnetic material pinned layer 52, a first tunnel layer 53 and a first magnetic material free layer 54 are laminated in this order from a lower layer. In the is used. When the read current IR is constant, as the resistance value of the magneto-resistive element 1 is larger, the potential V45 is higher, and as the resistance value is smaller, the potential V45 is lower. In short, the potential V45 reflects the resistance value of the magneto-resistive element 1. The comparing circuit 44 judges the data written in the target memory cell 10, based on the potential V45.

Specifically, the comparing circuit 44 compares the potential V45 with a reference potential Vref. The reference potential Vref is set to a middle potential between a potential V45 corresponding to the data "0" and a potential V45 corresponding to the data "1". Thus, the comparing circuit 44 can judge the data written in the target memory cell 10 by comparing the potential V45 and the reference potential Vref.

FIG. 3 is a sectional view showing a structure of the magneto-resistive element of the magnetic random access memory in the first exemplary embodiment of the present invention. The magneto-resistive element 1 includes a first magnetic material lamination unit 50, a non-magnetic conductor layer 55 and a second magnetic material lamination unit 60. In the first magnetic material lamination unit 50, a first anti-ferromagnetic material layer 51, a first magnetic material pinned layer 52, a first tunnel layer 53 and a first magnetic material free layer 54 are laminated in this order from a lower layer. In the first magnetic material pinned layer 52, a magnetization direction is pinned by anti-ferromagnetic coupling with the first anti-ferromagnetic material layer 51. In the second magnetic material lamination unit 60, a second anti-ferromagnetic material layer 59, a second magnetic material pinned layer 58, a second tunnel layer 57 and a second magnetic material free layer 56 are laminated in this order from an upper layer. In the second magnetic material pinned layer 58, a magnetization direction is pinned by the anti-ferromagnetic coupling with the second anti-ferromagnetic material layer 59. The first magnetic material free layer 54 and the second magnetic material free layer 56 are anti-ferromagnetically-coupled through the non-magnetic conductor layer 56.

The magnetization directions of the first magnetic material pinned layer 52 and the second magnetic material pinned layer 58 are set to be approximately the same as any direction of directions (easy axis directions) in which the first magnetic material free layer 54 and the second magnetic material free layer 56 are easily magnetized, respectively. For example, in two directions of the easy axis directions of the first magnetic material free layer 54 and the second magnetic material free layer 56, in a state that a magnetic field is applied to the one direction, a temperature is increased to a blocking temperature or more of the first anti-ferromagnetic material layer 51 and the second anti-ferromagnetic material layer 59. Thus, the magnetization directions of the anti-ferromagnetic material layers are changed such that the magnetization directions of the first magnetic material pinned layer 52 and the second magnetic material pinned layer 58 become the direction of the applied magnetic field. After the temperature is decreased, the magnetization directions of the first magnetic material pinned layer 52 and the second magnetic material pinned layer 58 remain to be pinned to the same direction. Incidentally, the first magnetic material pinned layer 52 and the second magnetic material pinned layer 58 may have the synthetic ferrimagnet structure.

From the viewpoint of storing a data, the first magnetic material free layer 54, the non-magnetic conductor layer 55 and the second magnetic material free layer 56 are said to compose a magnetic material storage unit. From the viewpoint of controlling spin electrons, the first anti-ferromagnetic material layer 51, the first magnetic material pinned layer 52, the first tunnel layer 53, the second anti-ferromagnetic material layer 59, the second magnetic material pinned layer 58 and the second tunnel layer 57 are said to compose a spin control layer. From the viewpoint of supplying a write current IW, the current source circuit 43, the write line decoder 20, the first write line 21, the selection line decoder 30 and the selection line 31 are said to compose a current supply unit. From the viewpoint of controlling a write current IW, the write control circuit 41 is said to compose a control unit.

A manufacturing method of the magnetic random access memory in the first exemplary embodiment of the present invention will be described below. At first, a semiconductor integrated circuit, which includes transistors and wirings, are formed on a silicon substrate. An inter-layer insulating film is formed thereon, and tungsten plugs for connections among those transistors and wirings are formed.

Next, a Ta film (film thickness of 30 nm) as the lower electrode of the magneto-resistive element 1 is formed on the entire surface. After that, a PtMn film (film thickness of 10 to 20 nm) as the first anti-ferromagnetic material layer 51, a CoFe film (film thickness of 2 to 5 nm) as the first magnetic material pinned layer 52, an AlO film (film thickness of 0.6 to 1.2 nm) as the first tunnel layer 53, a CoFeB film (film thickness of 1 to 5 nm) as the first magnetic material free layer 54, a Ru film (film thickness of 0.5 to 1.5 nm) as the non-magnetic conductor layer, a CoFeB film (film thickness of 1 to 5 nm) as the second magnetic material free layer 56, an AlO film (film thickness of 0.4 to 0.7 nm) as the second tunnel layer 57, a CoFe film (film thickness of 2 to 5 nm) as the second magnetic material pinned layer 58, and a PtMn film (film thickness of 10 to 20 nm) as the second anti-ferromagnetic material layer 59 are formed by a sputtering technique, respectively. Moreover, as the upper electrode, a Ta film (film thickness of 100 nm) is formed, and a SiO$_2$ film (film thickness of 50 nm) is formed thereon.

In succession, by using a photolithography technique, resist remains in the shape of the magneto-resistive element 1, and the SiO$_2$ film is processed by an RIE (reactive ion etching) technique. The shape of the magneto-resistive element 1 is, for example, an ellipse. With such a shape, shape anisotropy is generated in a major axis direction, and a magnetization direction becomes stable in the direction along the major axis. After an ashing removal of the resist, the processed SiO$_2$ is used as a mask, and a portion between the Ta film of the upper electrode and the first magnetic material free layer 54 is milling-processed to expose the surface of the first tunnel layer 53. Next, a SiN film (film thickness of 30 nm) is formed as a protective film. After that, resist remains in the shape of the lower electrode, the SiN film and the portion between the first tunnel layer 53 and the lower electrode are milling-processed. After that, the resist is removed by ashing. Consequently, the magneto-resistive element 1 (FIG. 3) can be formed.

Next, a SiO$_2$ film (film thickness of 400 nm) is formed on the entire surface and made flat by the CMP process. By a photolithography technique and an RIE technique, contact holes are opened for the upper electrode, the lower electrode and the lower layer wirings. A Ti film (film thickness of 10 nm), an AlCu film (film thickness of 400 nm) and a TiN film (film thickness of 10 nm) are formed on the entire surface, and they are processed to shapes of the first write line 21*a* and the other wirings by a photolithography technique and an RIE technique. As mentioned above, the magnetic random access memory is manufactured.

An operation of the magnetic random access memory in the first exemplary embodiment of the present invention will be described below with reference to FIG. 2 and FIG. 3.

At first, a case of writing the data "0" will be explained. The write control circuit 41 outputs the write line address signal indicating the address of the target memory cell 10 and the current direction signal indicating the writing of the "0", to the write line decoder 20. The write line decoder 20 connects the first write line 21*a* connected to the target memory cell 10 and the current source circuit 43. The first write line 21*b* connected to the target memory cell 10 is grounded. Also, the other first write lines 21*a* and first write lines 21*b* are grounded. The write control circuit 41 further outputs the selection line address signal to the selection line decoder 30. The selection line decoder 30 activates the selection line 31 connected to the target memory cell 10 and turns on the selecting transistor 9. The selection line decoder 30 deactivates the other selection lines 31 and turns off the other selecting transistors 9. The write control circuit 41 further instructs the current source circuit 43 to supply the desirable write current IW, for example, 1 mA. Thus, the write current IW flows through a route following the write line decoder 20, the first write line 21*a*, the upper electrode, the magneto-resistive element 1, the lower electrode, the first write line 21 and the ground in this order.

That is, the current flows from the upper electrode to the lower electrode. At this time, electrons are transferred from the first magnetic material pinned layer 52 to the first magnetic material free layer 54. When the pinned direction of the first magnetic material pinned layer 52 is rightward, electron group whose spin direction distribution is biased rightward is transferred to the first magnetic material free layer 54. Thus, the magnetization direction of the first magnetic material free layer 54 becomes rightward. Moreover, since the pinned direction of the second magnetic material pinned layer 58 is also rightward, the electrons having the leftward spin are hard to flow in the portion of the second magnetic material pinned layer 58. Hence, in the second magnetic material free layer 56, there are many electrons having the leftward spin. Therefore, the magnetization direction of the second magnetic material free layer 56 becomes leftward. Since the first magnetic material free layer 54 and the second magnetic material free layer 56 are antiferromagnetically-coupled with each other, the first magnetic material free layer 54 is rightward, and the second magnetic material free layer 56 is leftward.

After a predetermined time, the current is stopped. Then, the first write line 21a and the first write line 21b are grounded by the write line decoder 20, and the selection line 31 is grounded by the selection line 31. Thus, the writing operation of the data "0" is completed.

A case of writing the data "1" will be described blow. The write control circuit 41 outputs the write line address signal indicating the address of the target memory cell 10 and the current direction signal indicating the writing of the "1", to the write line decoder 20. The write line decoder 20 connects the first write line 21b connected to the write memory cell 10 and the current source circuit 43. Also, the first write line 21a connected to the write memory cell 10 is grounded. The other first write lined 21a and first write lined 21b are grounded. The write control circuit 41 further outputs the selection line address signal to the selection line decoder 30. The selection line decoder 30 activates the selection line 31 connected to the write memory cell 10 and turns on the selecting transistor 9. The selection line decoder 30 deactivates the other selection lines 31 and turns off the other selecting transistors 9. The write control circuit 41 further instructs the current source circuit 43 to supply the desirable write current IW, for example, 1 mA. Thus, the write current IW flows through a route following the write line decoder 20, the first write line 21b, the lower electrode, the magneto-resistive element 1, the upper electrode, the first write line 21a and the ground in this order.

That is, oppositely to the case of writing the data "0", the current flows from the lower electrode to the upper electrode. At this time, electrons are transferred from the second magnetic material pinned layer 58 to the second magnetic material free layer 56. When the pinned direction of the second magnetic material pinned layer 58 is rightward, electron group whose spin direction distribution is biased rightward is transferred to the second magnetic material free layer 56. Thus, the magnetization direction of the second magnetic material free layer 56 becomes rightward. Moreover, since the pinned direction of the first magnetic material pinned layer 52 is also rightward, electrons having leftward spin are hard to flow in the portion of the first magnetic material pinned layer 52. Hence, in the first magnetic material free layer 54, there are many electrons having the leftward spin. Hence, the magnetization direction of the first magnetic material free layer 54 becomes leftward. Since the second magnetic material free layer 56 and the first magnetic material free layer 54 are antiferromagnetically-coupled with each other, the second magnetic material free layer 56 is rightward, and the first magnetic material free layer 54 is leftward.

After the predetermined time, the current is stopped. Then, the first write line 21a and the first write line 21b are grounded by the write line decoder 20, and the selection line 31 is grounded by the selection line 31. Thus, the writing operation of the data "1" is completed. Thus, it is possible to set the two states in which the magnetization directions are different. Moreover, a magnetic field generated by a current flowing through a wiring arranged near the memory cell 10 can be used as an assistant for the writing.

A case of reading the data will be described below. The read control circuit 42 outputs the write line address signal indicating the address of the target memory cell 10 and the read signal indicating the reading operation, to the write line decoder 20. The write line decoder 20 connects the first write line 21a connected to the target memory cell 10 and the current source circuit 43. Also, the first write line 21b connected to the target memory cell 10 is grounded. The read control circuit 42 further outputs the selection line address signal to the selection line decoder 30. The selection line decoder 30 activates the selection line 31 connected to the target memory cell 10 and turns on the selecting transistor 9. The selection line decoder 30 deactivates the other selection lines 31 and turns off the other selecting transistors 9. The read control circuit 42 further instructs the current source circuit 43 to supply the desirable read current IW, for example, 0.2 mA. Hence, the read current IR flows through the route following the write line decoder 20, the first write line 21a, the upper electrode, the magneto-resistive element 1, the lower electrode, the first write line 21b and the ground in this order.

That is, the current flows from the upper electrode to the lower electrode. Here, when a resistance value of the magneto-resistive element 1 and the selecting transistor 9 has any value of 1 kΩ and 1.4 kΩ on the basis of the stored data, a value of the potential V45 becomes any of 0.2 V and 0.28 V. The comparing circuit 44 can judge the stored data by comparing Vref=0.24 V with the value of the potential V45.

At this time, when the first magnetic material pinned layer 52 and the first magnetic material free layer 54 have the same magnetization directions and become in a state of a low resistance value, the second magnetic material pinned layer 58 and the second magnetic material free layer 56 have the opposite magnetization directions and become in a state of a high resistance value. Reversely, when the first magnetic material pinned layer 52 and the first magnetic material free layer 54 have the opposite magnetization directions and become in a state of a high resistance value, the second magnetic material pinned layer 58 and the second magnetic material free layer 56 are the same magnetization directions and become in a state of a low resistance value. The magnetic resistance (TMR resistance) has a value of sum of both resistance values. However, when both of the resistance values are equal, they cancel out each other, and the magnetic resistance is not changed. Hence, a difference is required to be set between the thickness of the first tunnel layer 53 and the thickness of the second tunnel layer 57. In a case of an ellipse magneto-resistive element 1 in which a length of the minor axis is 0.6 μm and a length of the major axis is 1.8 μm, when alumina films with a film thickness of 0.86 nm and a film thickness of 0.99 nm were manufactured for the first tunnel layer 53 and the second tunnel layer 57, respectively, the resistance values were 6 kΩ and 17 kΩ, respectively. The tunnel resistance is changed exponentially for the tunnel film thickness. Thus, when the film thickness difference of about 0.39 nm is set, the resistance difference of about 9 times can be obtained. Hence, the entire resistance of the magneto-resistive element 1 can be approximately determined in the tunnel layer on the thicker side.

In this exemplary embodiment, in both of the writings of data "1" and "0", the data are rewritten by using both of the principles of the spin electron transfer from one pinned layer and the spin electron selection pass through the other pinned layer at one time. Thus, the write properties become similar independently of the data, and the writing circuit becomes easy.

Second Exemplary Embodiment

A second exemplary embodiment of the magnetic random access memory and the operating method of the same of the present invention will be described below with reference to the attached drawings. At first, a configuration of the magnetic random access memory in the second exemplary embodiment of the present invention will be described.

Figure 4:
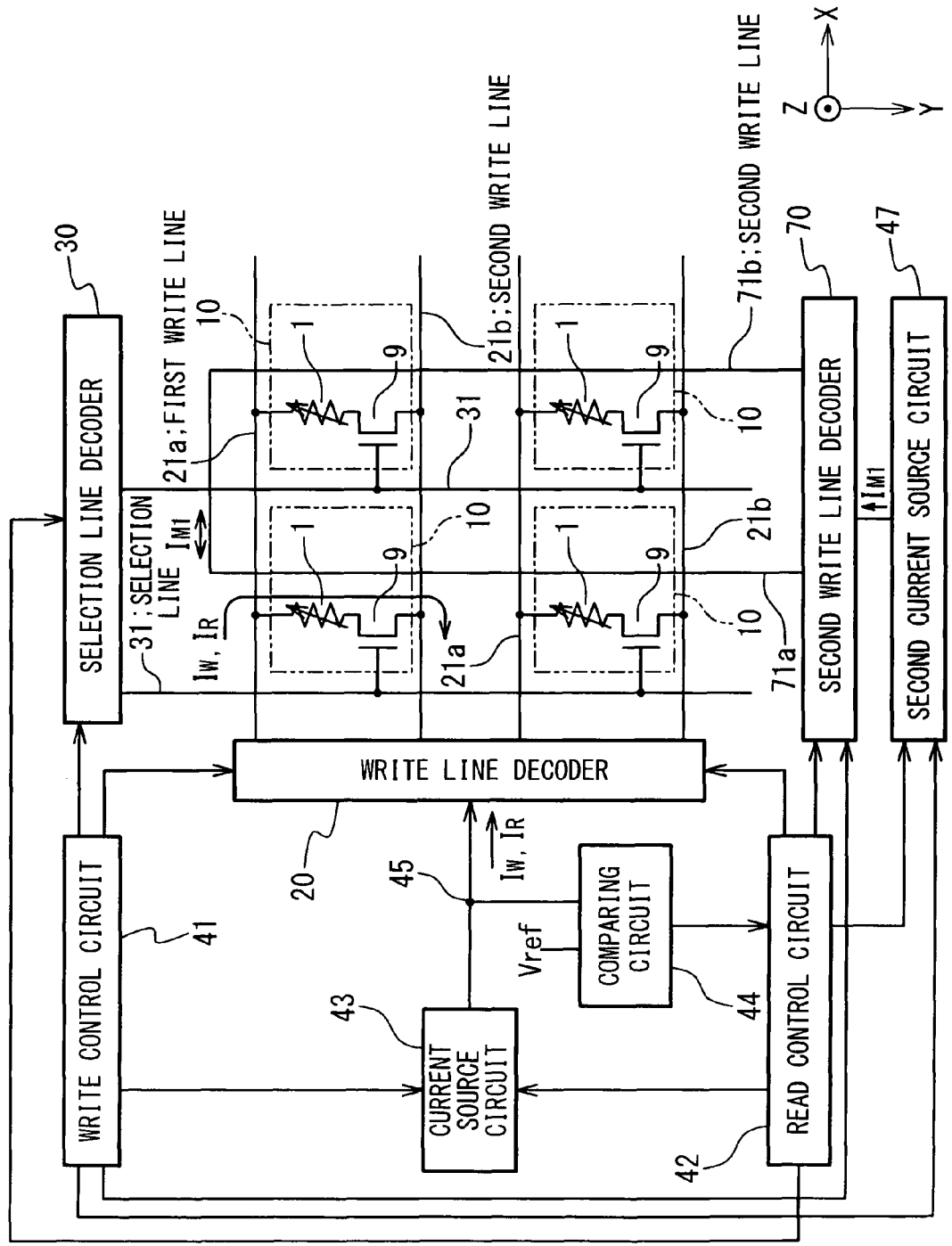
FIG. 4 is a block diagram showing a configuration of a magnetic random access memory in a second exemplary embodiment of the present invention.

FIG. 4 is a block diagram showing a configuration of the magnetic random access memory in the second exemplary embodiment of the present invention. The magnetic random access memory in this exemplary embodiment differs from the magnetic random access memory in the first exemplary embodiment, in that this further includes a second current source circuit 47, a second write line decoder 70 and a plurality of second write lines 71 and in the structure of the magneto-resistive element 1.

The second write line 71 (71a, 71b), of which one end is connected to the second write line decoder 70, extends in a Y-direction. As for the second write line 71a on the odd-numbered row in the memory cell 10, the other end thereof is connected to the second write line 71b on the even-numbered row adjacent thereto. For example, the current supplied from the second write line decoder 70 to any one of second write line 71a on the first row and the second write line 71b on the second row is returned through the other to the second write line decoder 70. The second write line 71 (71a, 71b) is provided near the magneto-resistive element 1. Thus, the magnetic field generated by the current passing through the second write line 71 (71a, 71b) influences a magnetization of a first magnetic material reference layer 62 (described later) in the magneto-resistive element 1. However, the write current IW does not flow through the memory cells 10 except the memory cell 10 on which the writing is performed. Hence, even if those memory cells 10 are influenced by the magnetic field, the writing is never performed. Incidentally, the second write line 71a and the second write line 71b are not required to be connected to each other at the other ends thereof. In that case, the other ends may be connected to a proper termination circuit or grounded.

The write control circuit 41 outputs a first magnetization control signal, which adjusts a first magnetization current IM1, to the second current source circuit 47, in addition to the functions of the first exemplary embodiment. The write control circuit 41 further outputs a first magnetization current direction signal indicating a direction of the first magnetization current IM1 and a second write line address signal related to the address of the target memory cell 10, to the second write line decoder 70. The direction of the first magnetization current IM1 is determined on the basis of the data written to the target memory cell 10.

The current source circuit 47 supplies the first magnetization current IM1 through the second write line decoder 70 to the second write line 71 (71a, 71b) corresponding to the target memory cell 10. The current source circuit 47 supplies, changes and stops the first magnetization current IM1, in response to the first magnetization control signal from the write control circuit 41.

The second write line decoder 70 selects the second write line 71 linked to the target memory cell 10, in response to the second write line address signal from the write control circuit 41. Then, the second write line decoder 70 supplies the first magnetization current IM1 outputted by the second current source circuit 47 to the second write line 71 (71a, 71b) so that a direction of the current coincides with the direction indicated by the first magnetization current direction signal, in response to the first magnetization current direction signal from the write control circuit 41. At that time, one of the second write line 71a and the second write line 71b is connected to the second current source circuit 47, and the other is grounded.

The read control circuit 42 further outputs the read control signal, which adjusts the first magnetization current IM1 at the time of reading, to the second current source circuit 47, in addition to the functions of the first exemplary embodiment. The direction of the first magnetization current IM1 is the same direction, independently of the written data.

The current source circuit 47 further supplies the current, namely, the first magnetization current IM1, in a predetermined direction to the second write line 71 (71a, 71b) corresponding to the target memory cell 10 through the second write line decoder 70. The second current source circuit 47 supplies, changes and stops the first magnetization current IM1, in response to the read control signal from the read control circuit 42.

Since the other configurations are similar to those in the first exemplary embodiment, their explanations are omitted.

Figure 5A:
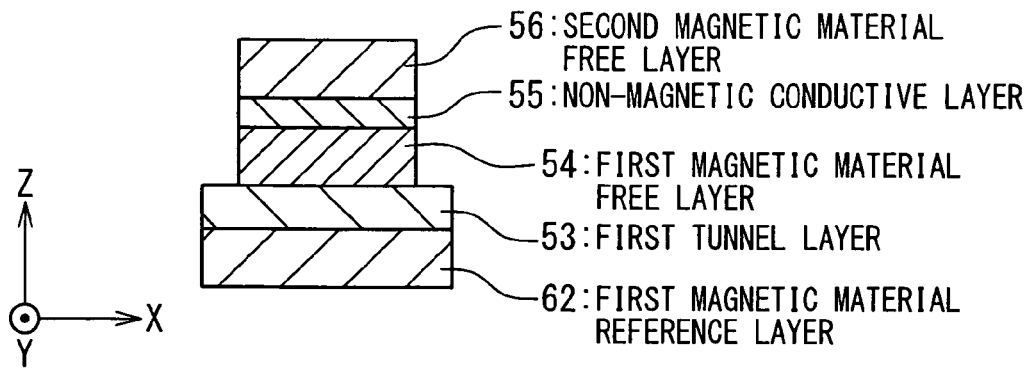
FIG. 5A is a sectional view showing a structure of a magneto-resistive element of the magnetic random access memory in the second exemplary embodiment of the present invention.
Figure 5B:
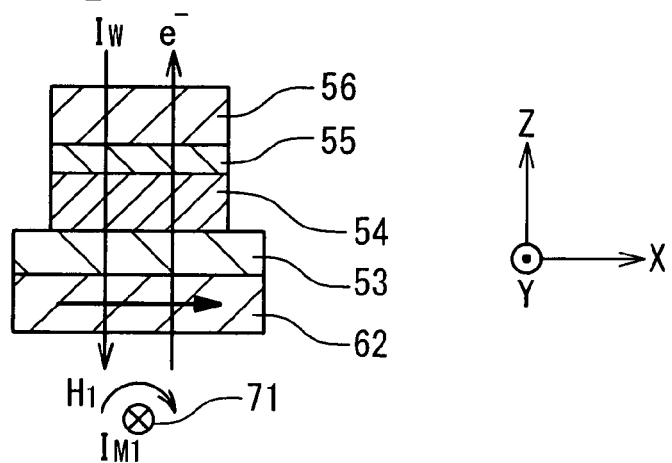
FIG. 5B is a sectional view showing a write principle of the magneto-resistive element of the magnetic random access memory in the second exemplary embodiment of the present invention.
Figure 5C:
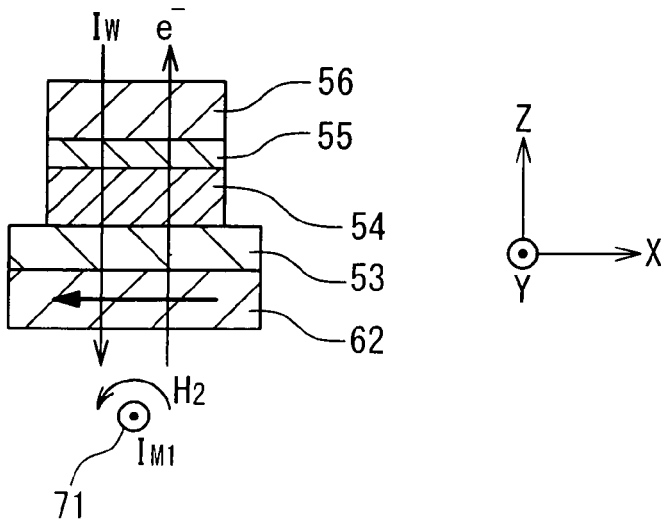
FIG. 5C is a sectional view showing the write principle of the magneto-resistive element of the magnetic random access memory in the second exemplary embodiment of the present invention.

FIG. 5A is a sectional view showing a structure (lamination structure) of the magneto-resistive element of the magnetic random access memory in the second exemplary embodiment of the present invention. FIG. 5B and FIG. 5C are sectional views showing a writing principle of the magneto-resistive element of the magnetic random access memory in the second exemplary embodiment of the present invention and shows a relation between the magnetic field generated by the current flowing through the second write line 71 and a magnetization direction of the first magnetic material reference layer 62.

With reference to FIG. 5A, the first magnetic material reference layer 62, the first tunnel layer 53, the first magnetic material free layer 54, the non-magnetic conductor layer 55 and the second magnetic material free layer 56 are laminated in this order from the lower layer, in the magneto-resistive element 1. The first magnetic material free layer 54 and the second magnetic material free layer 56 are antiferromagnetically-coupled with each other through the non-magnetic conductor layer 55. Magnetic anisotropy of the first magnetic material reference layer 62 is assumed to have a small value such as 10 Oe or less. The first magnetic material reference layer 62 may have a synthetic ferrimagnet structure.

With reference to FIG. 5B, when the first magnetization current IM1 of a −Y direction flows through the second write line 71 (71a, 71b), a magnetic field H1 is generated. Thus, the magnetization direction of the first magnetic material reference layer 62 whose magnetic anisotropy is small is set to the direction along the magnetic field H1. In FIG. 5B, the magnetization direction is set rightward. On the other hand, with reference to FIG. 5C, when the first magnetization current IM1 of a +Y direction flows through the second write line 71 (71a, 71b), a magnetic field H2 is generated. Thus, the magnetization direction of the first magnetic material reference layer 62 whose magnetic anisotropy is small is set to the direction along the magnetic field H2. In FIG. 5C, the magnetization direction is set leftward. In this way, the magnetization direction of the first magnetic material reference layer 62 is controlled based on the direction of the first magnetization current IM1 flowing through the second write line 71. At this time, the first magnetic material free layer 54 and the second magnetic material free layer 56 have large magnetic anisotropy and are not influenced by the magnetic fields H1, H2.

Figure 6A:
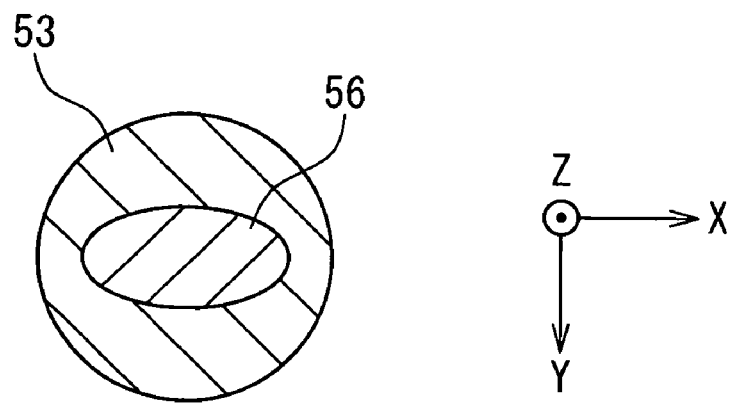
FIG. 6A is a top view showing a structure of the magneto-resistive element of the magnetic random access memory in the second exemplary embodiment of the present invention.
Figure 6B:
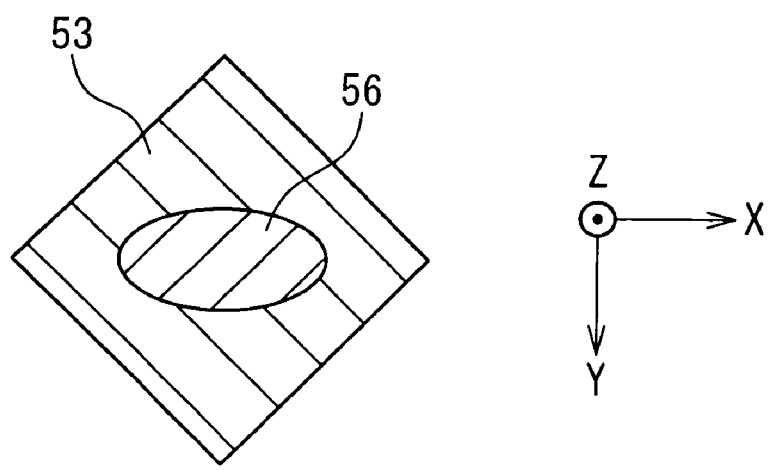
FIG. 6B is another top view showing a structure of the magneto-resistive element of the magnetic random access memory in the second exemplary embodiment of the present invention.

FIG. 6A and FIG. 6B are top views showing structures of the magneto-resistive element of the magnetic random access memory in the second exemplary embodiment of the present invention. The second magnetic material free layer 56, the non-magnetic conductor layer 55 and the first magnetic material free layer 54 are, for example, an approximate ellipse, and the magnetic anisotropy is large. On the other hand, the first tunnel layer 53 and the first magnetic material reference layer 62 have shapes, for example, close to a circle (FIG. 6A) or square (FIG. 6B), and the magnetic anisotropy is small. Specifically, they are ellipses or rectangles in which a ratio between a major side and a miner side is between about 1:1 and 1.3:1. A shape whose outer circumference is surrounded with a convex curve or a polygonal shape may be used.

From the viewpoint of storing a data, the first magnetic material free layer 54, the non-magnetic conductor layer 55 and the second magnetic material free layer 56 are said to compose a magnetic material storage unit. From the viewpoint of controlling spin electrons, the first magnetic material reference layer 62 and the first tunnel layer 53 are said to compose a spin control layer. From the viewpoint of supplying the write current IW, the current source circuit 43, the write line decoder 20, the first write lines 21, the selection line decoder 30 and the selection lines 31 are said to compose a current supply unit. On the other hand, from the viewpoint of controlling the write current IW and controlling states of spin electrons, the write control circuit 41, the second current source circuit 47, the second write line decoder 70 and the second write lines 71 are said to compose a control unit.

The manufacturing method of the magnetic random access memory in the second exemplary embodiment of the present invention will be described below. At first, a semiconductor integrated circuit, which includes transistors and wirings, are formed on a silicon substrate. An inter-layer insulating film is formed thereon, and tungsten plugs for connections among those wirings are formed.

Next, a Ta film (film thickness of 30 nm) as the lower electrode of the magneto-resistive element 1 is formed on the entire surface. After that, a NiFe film (film thickness of 2 to 5 nm) as the first magnetic material reference layer 62, an AlO film (film thickness of 0.6 to 0.7 nm) as the first tunnel layer 53, a NiFe film (film thickness of 1 to 5 nm) as the first magnetic material free layer 54, a Ru film (film thickness of 0.5 to 1.5 nm) as the non-magnetic conductor layer 55, and a NiFe film (film thickness of 1 to 5 nm) as the second magnetic material free layer 56 are formed by a sputtering technique. Moreover, as the upper electrode, a Ru film (film thickness of 20 nm) and a Ta film (film thickness of 100 nm) are formed, and a $SiO_2$ film (film thickness of 50 nm) is formed thereon.

In succession, by using a photolithography technique, resist remains in the shape of the magneto-resistive element 1, and the $SiO_2$ film is processed by an RIE (reactive ion etching) technique. The shape of the magneto-resistive element 1 is, for example, an ellipse. With such a shape, shape anisotropy is generated in a major axis direction, and a magnetization direction becomes stable in the direction along the major axis. After an ashing removal of the resist, by using the processed $SiO_2$ as the mask, a portion between the Ta film of the upper electrode and the first magnetic material free layer 54 is milling-processed to expose a surface of the first tunnel layer 53. Next, a SiN film (film thickness of 10 to 50 nm) and a $SiO_2$ film (film thickness of 100 nm) are formed as protective films. After that, resist remains in the shape of the desirable first magnetic material reference layer 62, and the $SiO_2$ film is RIE-processed. After the resist-ashing, a portion between the SiN film and the first magnetic material reference layer 62 is milling-processed.

At this time, since the first magnetic material reference layer 62 is shaped closely to a circle or square, the magnetic anisotropy can be small. For example, this is an ellipse or rectangle whose ratio between a major side and a miner side is between about 1:1 and 1.3:1. A shape whose outer circumference is surrounded with convex curves or a polygonal shape may be used. Next, after a formation of a protective film SiN (film thickness of 10 to 100 nm), resist remains in the desirable lower electrode shape, and a portion until the lower electrode is RIE-processed. After that, the resist is removed by ashing. Thus, the magneto-resistive element 1 (FIG. 5A) can be formed.

Next, a $SiO_2$ film (film thickness of 400 nm) is formed on the entire surface and made flat by a CMP process. By a photolithography technique and a RIE technique, contact holes are opened for the upper electrode, the lower electrode and the lower layer wiring. A Ti film (film thickness of 10 nm), an AlCu film (film thickness of 400 nm) and a TiN film (film thickness of 10 nm) are formed on the entire surface, and they are processed to shapes of the first write line 21a and the other wirings by a photolithography technique and a RIE technique.

Figures 7A, 7B, 7C:
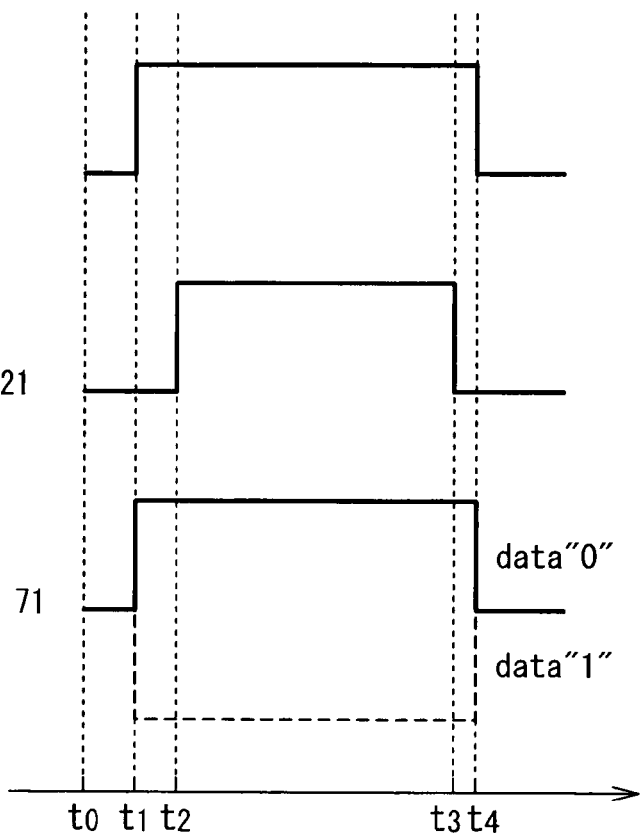
FIGS. 7A to 7C are timing charts with regard to an operation of the magnetic random access memory in the second exemplary embodiment of the present invention.

An operation of the magnetic random access memory in the second exemplary embodiment of the present invention will be described below with reference to FIG. 4, FIG. 5A to FIG. 5C and FIG. 7 (FIG. 7A to FIG. 7C). FIG. 7 (FIG. 7A to FIG. 7C) is a timing chart with regard to the operation of the magnetic random access memory in the second exemplary embodiment of the present invention.

At first, a case of writing the data "0" is explained. The write control circuit 41 outputs the write line address signal indicating the address of the target memory cell 10 to the write line decoder 20. The write line decoder 20 connects the first write line 21a connected to the target memory cell 10 and the current source circuit 43. Also, the first write line 21b connected to the write memory cell 10 is grounded. The other first write lines 21a and second write lines 21b are grounded. The write control circuit 41 further outputs the selection address signal to the selection line decoder 30. The selection line decoder 30 activates the selection line 31 connected to the target memory cell 10 and turns on the selecting transistor 9 (FIG. 7A: t1). The selection line decoder 30 deactivates the other selection lines 31 and turns off the other selecting transistors 9.

The write control circuit 41 further outputs the second write line address signal indicating the address of the target memory cell 10 and the first magnetization current direction signal indicating the writing of the "0", to the second write line decoder 70. The second write line decoder 70 connects the second write line 71 (ex. 71a) connected to the target memory cell 10 and the second current source circuit 47. The other second write line 71 (ex. 71b) connected to the second write line 71 (ex. 71a) is grounded. Also, the other second write lines 71 are grounded. The write control circuit 41 further instructs the second current source circuit 47 to supply the desirable first magnetization current IM1, for example, 1 mA. Thus, the first magnetization current IM1 flows through the desirable second write line 71 (FIG. 7C: t1), and the magnetic field H1 is generated. The magnetization direction of the first magnetic material reference layer 62 whose magnetic anisotropy is small is set by the magnetic field H1 (ex. the +X direction (rightward) when the direction of the first magnetization current IM1 is the −Y direction, as shown in FIG. 5B).

The write control circuit 41 further instructs the current source circuit 43 to supply the desirable write current IW, for example, 1 mA. Thus, the write current IW flows (FIG. 7B: t2) through the route following the write line decoder 20, the first write line 21a, the upper electrode, the magneto-resistive element 1, the lower electrode, the first write line 21b and the ground in this order.

That is, the current flows from the upper electrode to the lower electrode. At this time, spin electrons are transferred from the first magnetic material reference layer 62 to the first magnetic material free layer 54. Since the magnetization direction of the first magnetic material reference layer 62 is rightward, the first magnetic material free layer 54 becomes rightward. Hence, the second magnetic material free layer 56 that is antiferromagnetically-coupled with the first magnetic material free layer 54 becomes leftward.

After a predetermined time, the current is stopped (FIG. 7B: t3). Then, the first write line 21$a$, the second write line 71 (ex. 71$a$) and the selection line 31 are grounded by the write line decoder 20, the second write line decoder 70 and the selection line decoder 30, respectively (FIG. 7A, FIG. 7C: t4). Thus, the writing operation of the data "0" is completed.

At first, a case of writing the data "1" is explained. The write control circuit 41 outputs the write line address signal indicating the address of the target memory cell 10 to the write line decoder 20. The write line decoder 20 connects the first write line 21$a$ connected to the target memory cell 10 and the current source circuit 43. Also, the first write line 21$b$ connected to the target memory cell 10 is grounded. The other first write lines 21$a$ and second writing lines 21$b$ are grounded. The write control circuit 41 further outputs the selection address signal to the selection line decoder 30. The selection line decoder 30 activates the selection line 31 connected to the target memory cell 10 and turns on the selecting transistor 9 (FIG. 7A: t1). The selection line decoder 30 deactivates the other selection lines 31 and turns off the other selecting transistors 9.

The write control circuit 41 further outputs the second write line address signal indicating the address of the target memory cell 10 and the first magnetization current direction signal indicating the writing of the "1", to the second write line decoder 70. The second write line 71 (ex. 71$a$) connected to the target memory cell 10 is grounded by the second write line decoder 70. The other second write line 71 (ex. 71$b$) connected to the second write line 71 (ex.: 71$a$) and the second current source circuit 47 are connected. Also, the other second write lines 71 are grounded. The write control circuit 41 further instructs the second current source circuit 47 to supply the desirable first magnetization current IM1, for example, 1 mA. Thus, the first magnetization current IM1 in the opposite direction flows through the desirable second write line 71 (FIG. 7C: t1), and the magnetic field H2 is generated. The magnetization direction of the first magnetic material reference layer 62 whose magnetic anisotropy is small is set by the magnetic field H2 (ex. the −X direction (leftward) when the direction of the first magnetization current IM1 is the +Y direction, as shown in FIG. 5C).

The write control circuit 41 further instructs the current source circuit 43 to supply the desirable write current IW, for example, 1 mA. Thus, the write current IW flows (FIG. 7B: t2) through the route following the write line decoder 20, the first write line 21$a$, the upper electrode, the magneto-resistive element 1, the lower electrode, the first write line 21$b$ and the ground in this order.

That is, the current flows from the upper electrode to the lower electrode. At this time, spin electrons are transferred from the first magnetic material reference layer 62 to the first magnetic material free layer 54. Since the magnetization direction of the first magnetic material reference layer 62 is leftward, the first magnetic material free layer 54 becomes leftward. Hence, the second magnetic material free layer 56 that is antiferromagnetically-coupled with the first magnetic material free layer 54 becomes rightward.

After a predetermined time, the current is stopped (FIG. 7B: t3). Then, the first write line 21$a$, the second write line 71 (ex. 71$a$) and the selection line 31 are grounded by the write line decoder 20, the second write line decoder 70 and the selection line decoder 30, respectively (FIG. 7A, FIG. 7C: t4). Thus, the writing operation of the data "1" is completed. Hence, it is possible to set the two states in which the magnetization directions are different. Moreover, a magnetic field generated by supplying a current flowing through a wiring arranged near the memory cell 10 can be used as an assistant for the writing.

A case of reading a data will be described below. The read control circuit 42 outputs the write line address signal indicating the address of the target memory cell 10 to the write line decoder 20. The write line decoder 20 connects the first write line 21$a$ connected to the target memory cell 10 and the current source circuit 43. Also, the first write line 21$b$ connected to the target memory cell 10 is grounded. The read control circuit 42 further outputs the selection line address signal to the selection line decoder 30. The selection line decoder 30 activates the selection line 31 connected to the target memory cell 10 and turns on the selecting transistor 9. The selection line decoder 30 deactivates the other selection lines 31 and turns off the other selecting transistors 9.

The read control circuit 42 further outputs the second write line address signal indicating the address of the target memory cell 10 and the reading signal indicating the reading operation, to the second write line decoder 70. The second write line decoder 70 connects the second write line 71 (ex. 71$a$) connected to the target memory cell 10 and the second current source circuit 47. The second write line 71 (ex. 71$b$) connected to the second write line 71 (ex. 71$a$) is grounded.

The read control circuit 42 further instructs the current source circuit 47 to supply the desirable first magnetization current IM1, for example, 1 mA. Thus, the first magnetization current IM1 flows through the desirable second write line 71 and the magnetic field H1 is generated. The magnetization direction of the first magnetic material reference layer 62 whose magnetic anisotropy is small is set to a predetermined direction by the magnetic field H1. This direction is always constant in the reading operation. The read control circuit 42 further instructs the current source circuit 43 to supply the desirable read current IR, for example, 0.1 mA. Hence, the read current IR flows through the route following the write line decoder 20, the first write line 21$a$, the upper electrode, the magneto-resistive element 1, the lower electrode, the first write line 21$b$ and the ground in this order.

That is, the current flows from the upper electrode to the lower electrode. Here, when a resistance value of the magneto-resistive element 1 and the selecting transistor 9 has any value of 1 kΩ and 1.4 kΩ on the basis of the value of the stored data, a value of the potential V45 becomes any of 0.1 V and 0.14 V. The comparing circuit 44 can judge the stored data by comparing Vref=0.12 V with the value of the potential V45.

Figure 8A:
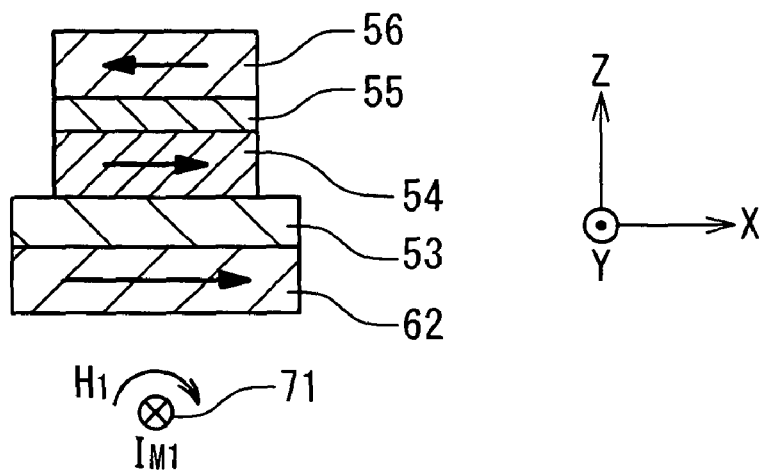
FIG. 8A is a sectional view showing a reading principle of an operation of the magnetic random access memory in the second exemplary embodiment of the present invention.
Figure 8B:
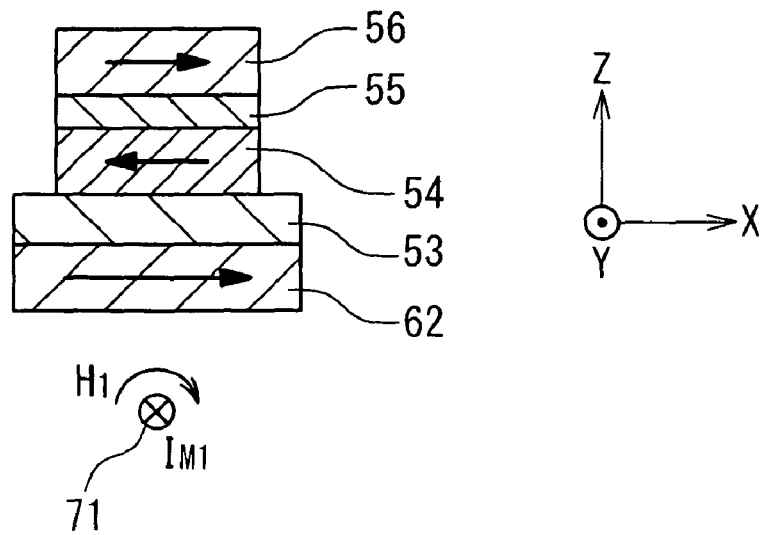
FIG. 8B is a sectional view showing the reading principle of the operation of the magnetic random access memory in the second exemplary embodiment of the present invention.

FIG. 8A and FIG. 8B are sectional views describing a reading principle in the operation of the magnetic random access memory in the second exemplary embodiment of the present invention. Here, in the memory cell 10, the case in which the magnetization directions of the second magnetic material free layer 56 and the first magnetic material free layer 54 are as shown in FIG. 8A (the second magnetic material free layer 56: the −X direction, the first magnetic material free layer 54: the +X direction) is assumed to be the state in which "0" is stored, and the case shown in FIG. 8B (56: the +X direction, 54: the −X direction) is assumed to be the state in which "1" is stored. With reference to FIG. 8A, at the time of the reading operation, since the first magnetization current IM1 flows through the second write line 71, the first magnetic material reference layer 62 is magnetized to the +X direction. In this first magnetization current IM1, the magnetization directions of the second magnetic material free layer 56 and the first magnetic material free layer 54 are not influenced. That is, when "0" as the data is stored in the memory cell 10, the relation of the magnetization direction between the second magnetic material free layer 56 and the first magnetic material free layer 54 is anti-parallel, and the relation of the magnetization direction between the first magnetic material free layer 54 and the first magnetic material reference layer 62 is parallel. On the other hand, with reference to FIG. 8B, when "1" as the data is stored in the memory cell 10, the relation of the magnetization direction between the second magnetic material free layer 56 and the first magnetic material free layer 54 is anti-parallel, and the relation of the magnetization direction between the first magnetic material free layer 54 and the first magnetic material reference layer 62 is also anti-parallel. In this way, the relations of the magnetization directions between the second magnetic material free layer 56, the first magnetic material free layer 54 and the first magnetic material reference layer 62 are different, which leads to the fact that the magnetic resistance value of the magneto-resistive element 1 is different. That is, the data can be read on the basis of the magnetic resistance value.

In this exemplary embodiment, at the time of the writing operation, the write current is supplied from the second magnetic material free layer 56 to the first magnetic material reference layer 62. Then, spin electrons are transferred from the first magnetic material reference layer 62 to the first magnetic material free layer 54. That is, the transferred electrons are used to carry out the writing. However, it is possible to carry out the writing by supplying the current to the opposite direction; namely, it is possible to carry out the writing by the reflected electrons.

For example, when the pinned direction of the first magnetic material reference layer 62 is made rightward, the electrons having leftward spin are hard to flow in the portion of the first magnetic material reference layer 62. Thus, in the first magnetic material free layer 54, there are many electrons having leftward spin. For this reason, the magnetization direction of the first magnetic material free layer 54 becomes leftward. Since the second magnetic material free layer 56 and the first magnetic material free layer 54 are antiferromagnetically-coupled with each other, the second magnetic material free layer 56 becomes rightward, and the first magnetic material free layer 54 becomes leftward. Reversely, when the pinned direction of the first magnetic material reference layer 62 is made leftward, electrons having rightward spin are hard to flow in the portion of the first magnetic material reference layer 62. Hence, in the first magnetic material free layer 54, there are many electrons having rightward spin. For this reason, the magnetization direction of the first magnetic material free layer 54 becomes rightward. Since the second magnetic material free layer 56 and the first magnetic material free layer 54 are antiferromagnetically-coupled with each other, the second magnetic material free layer 56 becomes leftward, and the first magnetic material free layer 54 becomes rightward.

In this exemplary embodiment, in both of the writings of data "1" and "0", spin electrons are transferred from the same first magnetic material reference layer 62, and the same principle is used to rewrite the data. Thus, the write properties become similar independently of the data, and the writing circuit becomes easy. The case of using reflection electrons can be the same.

Third Exemplary Embodiment

A third exemplary embodiment of the magnetic random access memory and an operating method of the same of the present invention and will be described below with reference to the attached drawings. At first, a configuration of the magnetic random access memory in the third exemplary embodiment of the present invention will be described.

Figure 9:
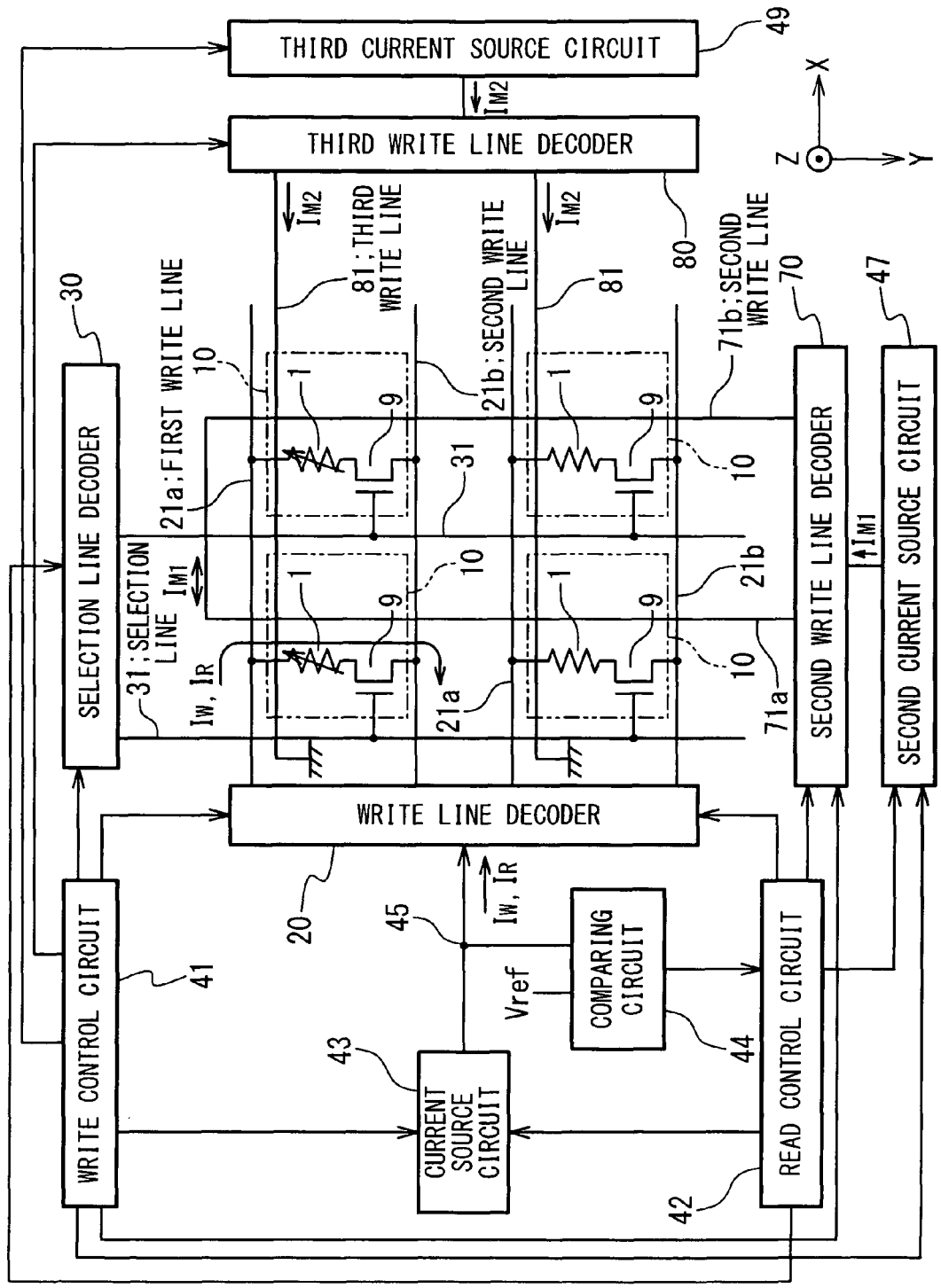
FIG. 9 is a block diagram showing a configuration of the magnetic random access memory in a third exemplary embodiment of the present invention.

FIG. 9 is a block diagram showing a configuration of the magnetic random access memory in the third exemplary embodiment of the present invention. The magnetic random access memory in this exemplary embodiment differs from the magnetic random access memory in the second exemplary embodiment, in that the magnetic random access memory further includes a third current source circuit 49, a third write line decoder 80 and a plurality of third write lines 81 and in a structure of the magneto-resistive element 1.

The third write line 81, of which one end is connected to the third write line decoder 80, extends to the X-direction. The other end is grounded. The third write line 81 is provided near the magneto-resistive element 1. For this reason, a magnetic field generated by a current passing through the third write line 81 influences magnetizations of the first magnetic material reference layer 62 and a second magnetic material reference layer 64 (described later) in the magneto-resistive element 1. However, the write current IW does not flow through the memory cell 10 except the memory cell 10 on which the writing is performed. Hence, even if those memory cells 10 are influenced by the magnetic field, the writing is never performed.

The write control circuit 41 outputs a second magnetization control signal, which adjusts a second magnetization current IM2, to the third current source circuit 49, in addition to the functions of the second exemplary embodiment. The write control circuit 41 further outputs a second magnetization current direction signal indicating the direction of the first magnetization current IM1 and a third write line address signal related to the address of the target memory cell 10, to the second write line decoder 70. The direction of the second magnetization current IM2 is constant irrespectively of the data written to the target memory cell 10. However, ends may be connected between those adjacent to each other, such as the second write line 71. The control in that case is similar to the control of the second write line decoder 70.

The current source circuit 49 supplies the second magnetization current IM2 through the third write line decoder 80 to the third write line 81 corresponding to the target memory cell 10. The current source circuit 49 supplies, changes and stops the second magnetization current IM2, in response to the second magnetization control signal from the write control circuit 41.

The third write line decoder 80 selects the third write line 81 linked to the target memory cell 10, in response to the third write line address signal from the write control circuit 41. Then, the third write line decoder 80 supplies the second magnetization current IM2 outputted by the third current source circuit 49 to the third write line 81 in a predetermined direction. At that time, the third write line 81 is connected to the third current source circuit 49.

The read control circuit 42 further outputs the read control signal, which adjusts the second magnetization current IM2 at the time of reading, to the third current source circuit 49, in addition to the functions of the second exemplary embodiment. The direction of the second magnetization current IM2 is the same direction independently of the written data.

The third current source circuit 49 further supplies the current, namely, the second magnetization current IM2, in a predetermined direction to the third write line 81 corresponding to the target memory cell 10 through the third write line decoder 80. The third current source circuit 49 supplies, changes and stops the second magnetization current IM2, in response to the read control signal from the read control circuit 42.

Since the other configurations are similar to those of the second exemplary embodiment, their explanations are omitted.

Figure 10A:
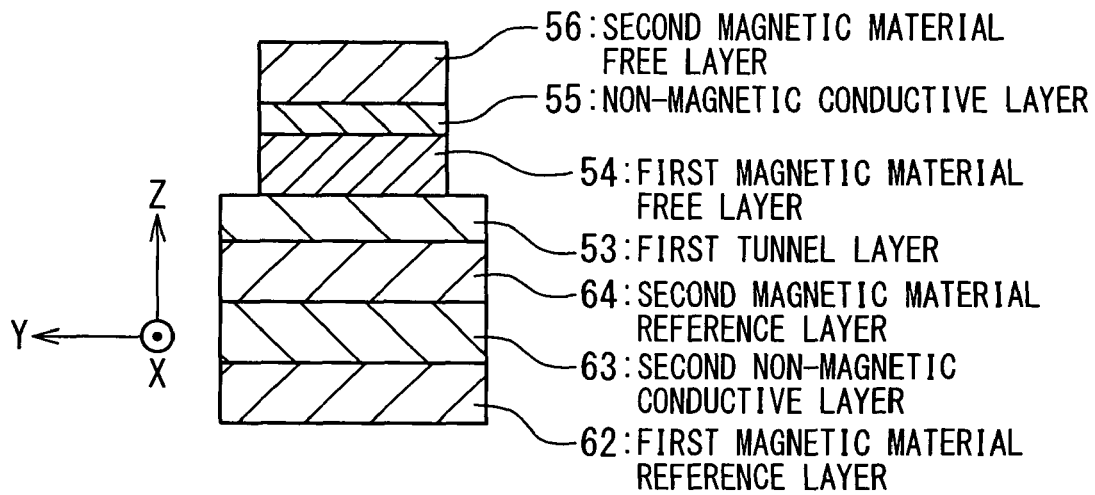
FIG. 10A is a sectional view showing a structure of a magneto-resistive element of the magnetic random access memory in the third exemplary embodiment of the present invention.
Figure 10B:
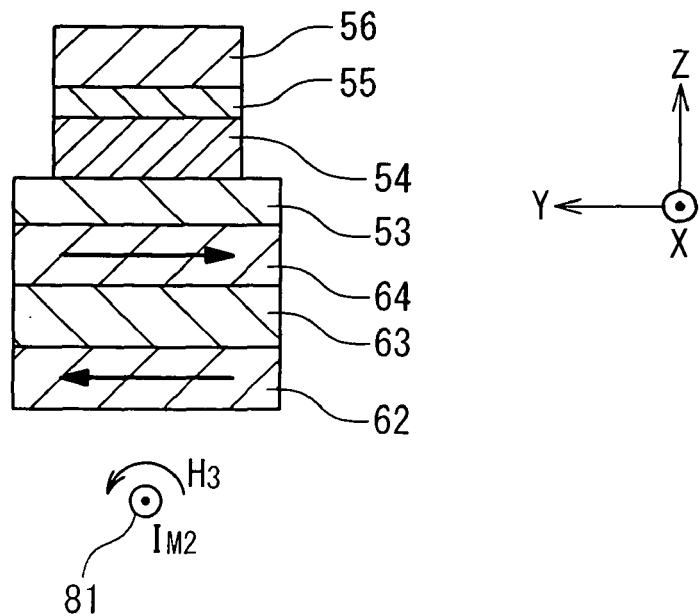
FIG. 10B is a sectional view showing a write principle of the magneto-resistive element of the magnetic random access memory in the third exemplary embodiment of the present invention.

FIG. 10A and FIG. 10B are sectional views showing structures of the magneto-resistive element of the magnetic random access memory in the third exemplary embodiment of the present invention. FIG. 10A shows a lamination structure. FIG. 10B shows a relation between the magnetic field generated by the current flowing through the third write line 81 and the magnetization directions of the first magnetic material reference layer 62 and a second magnetic material reference layer 65.

With reference to FIG. 10A, the first magnetic material reference layer 62, a second non-magnetic conductor layer 63, the second magnetic material reference layer 64, the first tunnel layer 53, the first magnetic material free layer 54, the non-magnetic conductor layer 55 and the second magnetic material free layer 56 are laminated in this order from the lower layer, in the magneto-resistive element 1. The first magnetic material free layer 54 and the second magnetic material free layer 56 are antiferromagnetically-coupled with each other through the non-magnetic conductor layer 55. The first magnetic material reference layer 62 and the second magnetic material reference layer 64 are antiferromagnetically-coupled with each other through the second non-magnetic conductor layer 63. Magnetic anisotropies of the first magnetic material reference layer 62 and the second magnetic material reference layer 64, which are antiferromagnetically-coupled with each other, are assumed to have small values such as 10 Oe or less. The other configurations are similar to those of the second exemplary embodiment.

With reference to FIG. 10B, when the second magnetization current IM2 of a +X direction flows through the third write line 81, a magnetic field H3 is generated. Thus, the magnetization direction of the first magnetic material reference layer 62 whose magnetic anisotropy is small is set to the direction along the magnetic field H3. In FIG. 10B, the magnetization direction is set leftward. Hence, the magnetization direction of the antiferromagnetically-coupled second magnetic material reference layer 64 is set to the −X direction (rightward) opposite thereto. The direction of the second magnetization current IM2 flowing through the third write line 81 is fixed to this one direction. At this time, the first magnetic material free layer 54 and the second magnetic material free layer 56 have large magnetic anisotropy and are not influenced by the magnetic field H3.

From the viewpoint of storing a data, the first magnetic material free layer 54, the non-magnetic conductor layer 55 and the second magnetic material free layer 56 are said to compose a magnetic material storage unit. From the viewpoint of controlling spin electrons, the first magnetic material reference layer 62, the second non-magnetic conductor layer 63, the second magnetic material reference layer 64 and the first tunnel layer 53 are said to compose a spin control layer. From the viewpoint of supplying a write current IW, the current source circuit 43, the write line decoder 20, the first write line 21, the selection line decoder 30 and the selection line 31 are said to compose a current supply unit. On the other hand, from the viewpoint of controlling a write current IW and controlling states of spin electrons, the write control circuit 41, the second current source circuit 47, the second write line decoder 70, the second write wiring 71, the third current source circuit 49, the third write line decoder 80 and the third write line 81 are said to compose a control unit.

The manufacturing method of the magnetic random access memory in the third exemplary embodiment of the present invention will be described below. At first, a semiconductor integrated circuit, which includes transistors and wirings, are formed on a silicon substrate. The inter-layer insulating film is formed thereon, and tungsten plugs for connections among those wirings are formed.

Next, a Ta film (film thickness of 30 nm) as the lower electrode of the magneto-resistive element 1 is formed on the entire surface. After that, a NiFe film (film thickness of 2 to 5 nm) as the first magnetic material reference layer 62, a Ru film (film thickness of 0.5 to 1.0 nm) as the second non-magnetic conductor layer 63, a CoFe film (film thickness of 5.1 nm) as the second magnetic material reference layer 64, an AlO film (film thickness of 0.3 to 0.8 nm) as the first tunnel layer 53, a NiFe film (film thickness of 1 to 5 nm) as the first magnetic material free layer 54, a Zr film (film thickness of 0.5 to 1.5 nm) as the non-magnetic conductor layer 55, and a NiFe film (film thickness of 1 to 5 nm) as the second magnetic material free layer 56 are formed by a sputtering technique. Moreover, as the upper electrode, a Ta film (film thickness of 100 nm) is formed, and a $SiO_2$ film (film thickness of 50 nm) is formed.

In succession, by using a photolithography technique resist remains in the shape of the magneto-resistive element 1, and the $SiO_2$ film is processed by a RIE technique. The shape of the magneto-resistive element 1 is, for example, an ellipse. With such a shape, shape anisotropy is generated in the major axis direction, and the magnetization direction becomes stable in the direction along the major axis. After an ashing removal of the resist, the processed $SiO_2$ is used as a mask, and a portion between the Ta film of the upper electrode and the first magnetic material free layer 54 is milling-processed to expose the surface of the first tunnel layer 53. Next, a SiN film (film thickness of 10 to 50 nm) and a $SiO_2$ film (film thickness of 100 nm) are formed as protective films. After that, resist remains in the shape of the desirable first magnetic material reference layer 62, and the $SiO_2$ film is RIE-processed. After the resist-ashing, a portion between the SiN film and the first magnetic material reference layer 62 is milling-processed.

At this time, since the first magnetic material reference layer 62 and the second magnetic material reference layer 64 are shaped closely to a circle or square, the magnetic anisotropy can be small. Next, after formation of a SiN film as a protective film (film thickness of 10 to 100 nm), resist remains in the desirable lower electrode shape, and the portion until the lower electrode is RIE-processed. After that, the resist is removed by ashing. Thus, the magneto-resistive element 1 (FIG. 10A and FIG. 10B) can be formed.

Next, a $SiO_2$ film (film thickness of 400 nm) is formed on the entire surface and made flat by a CMP process. By a photolithography technique and a RIE technique, contact holes are opened for the upper electrode, the lower electrode and the lower layer wiring. A Ti film (film thickness of 10 nm), an AlCu film (film thickness of 400 nm) and a TiN film (film thickness of 10 nm) are formed on the entire surface, and they are processed to the shapes of the first write line 21a and the other wirings by a photolithography technique and a RIE technique.

The operation of the magnetic random access memory in the second exemplary embodiment of the present invention will be described below with reference to FIG. 9, FIG. 10A, FIG. 10B and FIG. 11 (FIG. 11A to FIG. 11D). FIG. 11 (FIG. 11A to FIG. 11D) is a timing chart with regard to the operation of the magnetic random access memory of the second exemplary embodiment of the present invention.

Figure 1:
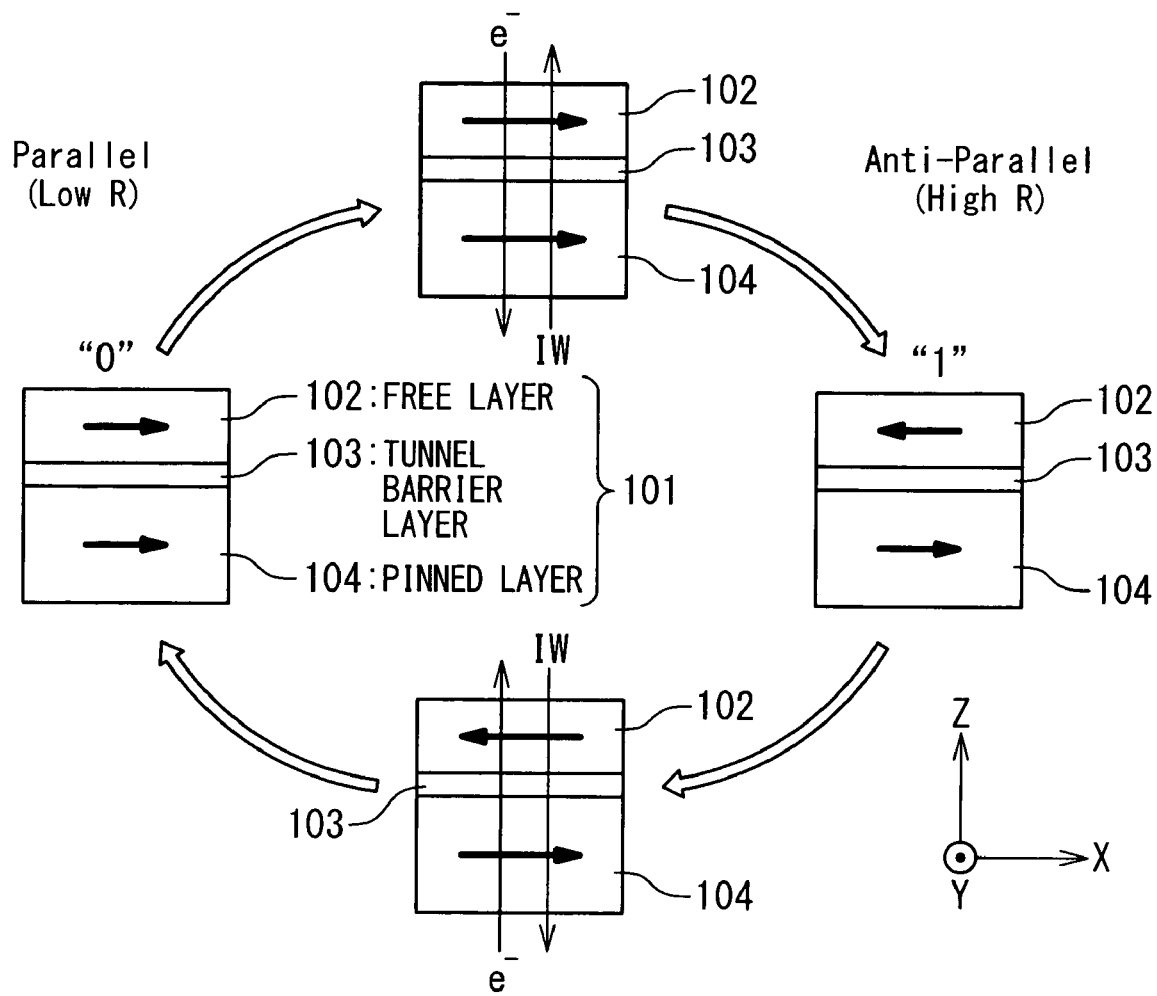
FIG. 1 is a schematic view showing situations of magnetization switching in a spin transfer process.

At first, a case of writing the data "0" is explained. The write control circuit 41 outputs the write line address signal indicating the address of the target memory cell 10 to the write line decoder 20. The write line decoder 20 connects the first write line 21a connected to the target memory cell 10 and the current source circuit 43. Also, the first write line 21b connected to the target memory cell 10 is grounded. The other first write line 21a and second writing line 21b are grounded. The write control circuit 41 further outputs the selection address signal to the selection line decoder 30. The selection line decoder 30 activates the selection line 31 connected to the target memory cell 10 and turns on the selecting transistor 9 (FIG. 1A: t1). The selection line decoder deactivates the other selection lines 31 and turns off the other selecting transistors 9.

The write control circuit 41 further outputs a third write line address signal indicating the address of the target memory cell 10 to the third write line decoder 80. The third write line decoder 80 connects the third write line 81 connected to the target memory cell 10 and the third current source circuit 49. The other third write lines 81 are grounded. The write control circuit 41 further instructs the third current source circuit 49 to supply the desirable second magnetization current IM2, for example, 1 mA. Thus, the second magnetization current IM2 flows through the desirable third write line 81 (FIG. 11D: t1), and the magnetic field H3 is generated. The magnetization direction of the first magnetic material reference layer 62 whose magnetic anisotropy is small is set by the magnetic field H3. Correspondingly to it, the magnetization direction of the second magnetic material reference layer 64 is also set (ex. as shown in FIG. 10B, since the second magnetization current IM2 has the +X direction, the magnetization direction of the first magnetic material reference layer 62 is the +Y direction (rightward), and the magnetization direction of the second magnetic material reference layer 64 is the −Y direction (leftward)). This magnetic field H3 is decreased together with the decrease in the second magnetization current IM2 (FIG. 11D)).

Figure 11A:
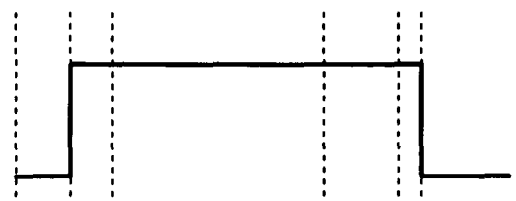
FIGS. 11A to 11D are timing charts with regard to an operation of the magnetic random access memory in the second exemplary embodiment of the present invention.

The write control circuit 41 further outputs the second write line address signal indicating the address of the target memory cell 10 and the first magnetization current direction signal indicating the writing of "0", to the second write line decoder 70. The second write line decoder 70 connects the second write line 71 (ex. 71a) connected to the write memory cell 10 and the second current source circuit 47. The other second write line 71 (ex. 71b) connected to the second write line 71 (ex. 71a) is grounded. Also, the other second write lines 71 are grounded. The write control circuit 41 further instructs the second current source circuit 47 to supply the desirable first magnetization current IM1, for example, 0.1 mA. Thus, the first magnetization current IM1 flows through the desirable second write line 71 (FIG. 11C: t2) and the magnetic field H1 is generated. This magnetic field H1 is increased together with the increase in the first magnetization current IM1 (FIG. 11C).

The write control circuit 41 further instructs the current source circuit 43 to supply the desirable write current IW, for example, 1 mA. Thus, the write current IW flows (FIG. 11B: t2) through the route following the write line decoder 20, the first write line 21a, the upper electrode, the magneto-resistive element 1, the lower electrode, the first write line 21b and the ground in this order.

That is, the current flows from the upper electrode to the lower electrode. At this time, spin electrons are transferred from the second magnetic material reference layer 64 to the first magnetic material free layer 54. Thus, the magnetization direction of the first magnetic material free layer 54 has the same direction as the magnetization direction of the second magnetic material reference layer 64, and the second magnetic material free layer 56 has the opposite direction.

Here, as mentioned above, the magnetic field H3 in the Y-direction is decreased with the temporal elapse, and the magnetic field H1 in the X-direction is increased with the temporal elapse. That is, the magnetization direction of each reference layer is originally oriented to the Y-direction parallel to the magnetic field H3. However, in association with the increase in the magnetic field H1, the magnetization direction of each reference layer is oriented (rotates) to the direction of the synthesis magnetic field of the magnetic field H3 and the magnetic field H1. Then, at a time t3, the magnetic field H3 becomes zero, and the magnetization direction of each reference layer is oriented to the X-direction. From the time t3 to time t4, the magnetization direction of each reference layer becomes in the same situation as the second exemplary embodiment (FIG. 7A to FIG. 7C: from t2 to t3). That is, from the time t1 to time t2, the respective magnetization directions of the first magnetic material reference layer 62, the second magnetic material reference layer 64, the first magnetic material free layer 54 and the second magnetic material free layer 56 are the +Y direction, the −Y direction, the +Y direction and the −Y direction, respectively. From the time t2 to time t3, the respective magnetization directions are rotated, and become the synthesis direction of the +Y direction and the +X direction, the synthesis direction of the −Y direction and the −X direction, the synthesis direction of the +Y direction and the +X direction, and the synthesis direction of the −Y direction and the −X direction, respectively. Then, from the time t3 to time t4, the respective magnetization directions are further rotated, and become the +X direction, the −X direction, the +X direction and the −X direction, respectively.

Figure 11B:
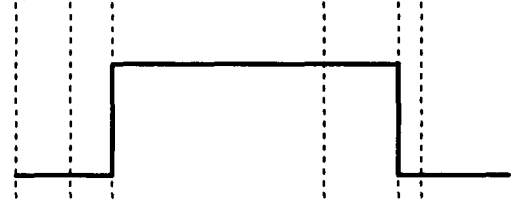
Figure 11C:
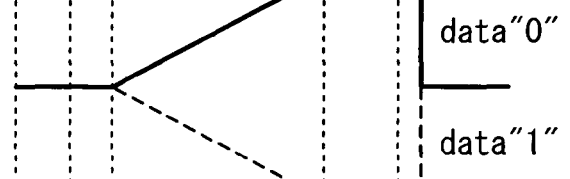
Figure 11D:
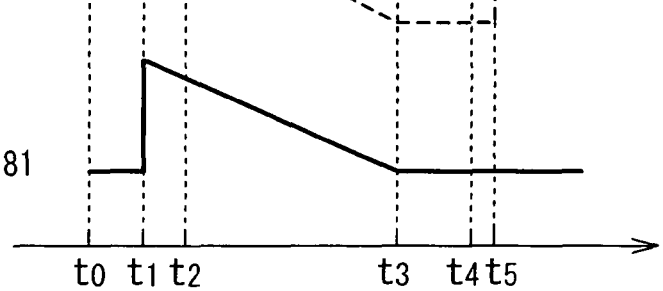

After a predetermined time, the write current IW is stopped (FIG. 11B: t4). Then, the first write line 21a, the second write line 71 (ex. 71a), the third write line 81 and the selection line 31 are grounded by the write line decoder 20, the second write line decoder 70, the third write line decoder 80 and the selection line decoder 30, respectively (FIG. 11A, FIG. 11C, FIG. 11D: t5). Thus, the writing operation of the data "0" is completed.

Next, a case of writing the data "1" is explained. The write control circuit 41 outputs the write line address signal indicating the address of the target memory cell 10 to the write line decoder 20. The write line decoder 20 connects the first write line 21a connected to the target memory cell 10 and the current source circuit 43. Also, the first write line 21b connected to the target memory cell 10 is grounded. The other first write lines 21a and second writing lines 21b are grounded. The write control circuit 41 further outputs the selection address signal to the selection line decoder 30. The selection line decoder 30 activates the selection line 31 connected to the target memory cell 10 and turns on the selecting transistor 9 (FIG. 11A: t1). The selection line decoder 30 deactivates the other selection lines 31 and turns off the other selecting transistors 9.

The write control circuit 41 further outputs the third write line address signal indicating the address of the target memory cell 10 to the third write line decoder 80. The third write line decoder 80 connects the third write line 81 connected to the target memory cell 10 and the third current source circuit 49. The other third write lines 81 are grounded. The write control circuit 41 further instructs the third current source circuit 49 to supply the desirable second magnetization current IM2, for example, 1 mA. Thus, the second magnetization current IM2 flows through the desirable third write line 81 (FIG. 11D: t1), and the magnetic field H3 is generated. The magnetization direction of the first magnetic material reference layer 62 whose magnetic anisotropy is small is set by the magnetic field H3. Correspondingly to it, the magnetization direction of the second magnetic material reference layer 64 is also set (Ex. as shown in FIG. 10B, since the second magnetization current IM2 has the +X direction, the magnetization direction of the first magnetic material reference layer 62 is the +Y direction (rightward), and the magnetization direction of the second magnetic material reference layer 64 is the −Y direction (leftward)). This magnetic field H3 is decreased together with the decrease in the second magnetization current IM2 (FIG. 11D)).

The write control circuit 41 further outputs the second write line address signal indicating the address of the target memory cell 10 and the first magnetization current direction signal indicating the writing of "1", to the second write line decoder 70. The second write line 71 (ex. 71*a*) connected to the target memory cell 10 is grounded by the second write line decoder 70. The other second write line 71 (ex. 71*b*) connected to the second write line 71 (ex. 71*a*) and the second current source circuit 47 are connected. Also, the other second write line 71 is grounded. The write control circuit 41 further instructs the second current source circuit 47 to supply the desirable first magnetization current IM1, for example, 0.1 mA. Thus, the first magnetization current IM1 of the opposite direction flows (FIG. 11C: t2) through the desirable second write line 71, and the magnetic field H2 is generated. This magnetic field H2 is increased together with the increase in the first magnetization current IM1 (FIG. 11C).

The write control circuit 41 further instructs the current source circuit 43 to supply the desirable write current IW, for example, 1 mA. Thus, the write current IW flows (FIG. 11B: t2) through the route following the write line decoder 20, the first write line 21*a*, the upper electrode, the magneto-resistive element 1, the lower electrode, the first write line 21*b* and the ground in this order.

That is, the current flows from the upper electrode to the lower electrode. At this time, spin electrons are transferred from the second magnetic material reference layer 64 to the first magnetic material free layer 54. Thus, the magnetization direction of the first magnetic material free layer 54 has the same direction as the magnetization direction of the second magnetic material reference layer 64, and the second magnetic material free layer 56 has the opposite direction.

Here, as mentioned above, the magnetic field H3 in the Y-direction is decreased with the temporal elapse, and the magnetic field H2 in the X-direction is increased with the temporal elapse. That is, the magnetization direction of each reference layer is originally oriented to the Y-direction parallel to the magnetic field H3. However, in association with the increase in the magnetic field H2, the magnetization direction of each reference layer is oriented (rotates) to the direction of the synthesis magnetic field of the magnetic field H3 and the magnetic field H2. Then, at the time t3, the magnetic field H3 becomes zero, and the magnetization direction of each reference layer is oriented to the X-direction. From the time t3 to time t4, the magnetization direction of each reference layer becomes in the same situation as the second exemplary embodiment (FIG. 7A to FIG. 7C: between t2 and t3). That is, from the time t1 to time t2, the respective magnetization directions of the first magnetic material reference layer 62, the second magnetic material reference layer 64, the first magnetic material free layer 54 and the second magnetic material free layer 56 are the +Y direction, the −Y direction, the +Y direction and the −Y direction, respectively. From the time t2 to time t3, the respective magnetization directions are rotated, and become the synthesis direction of the +Y direction and the −X direction, the synthesis direction of the −Y direction and the +X direction, the synthesis direction of the +Y direction and the −X direction, and the synthesis direction of the −Y direction and the +X direction, respectively. Then, from the time t3 to time t4, the respective magnetization directions are further rotated, and become the −X direction, the +X direction, the −X direction and the +X direction, respectively.

After the predetermined time, the write current IW is stopped (FIG. 11B: t4). Then, the first write line 21*a*, the second write line 71 (ex. 71*a*), the third write line 81 and the selection line 31 are grounded by the write line decoder 20, the second write line decoder 70, the third write line decoder 80 and the selection line decoder 30, respectively (FIG. 11A, FIG. 11C, FIG. 11D: t5). Thus, the writing operation of the data "1" is completed.

The case of reading the data will be described below. The read control circuit 42 outputs the write line address signal indicating the address of the target memory cell 10 to the write line decoder 20. The write line decoder 20 connects the first write line 21*a* connected to the target memory cell 10 and the current source circuit 43. Also, the first write line 21*b* connected to the target memory cell 10 is grounded. The read control circuit 42 further outputs the selection line address signal to the selection line decoder 30. The selection line decoder 30 activates the selection line 31 connected to the target memory cell 10 and turns on the selecting transistor 9. The selection line decoder 30 deactivates the other selection lines 31 and turns off the other selecting transistors 9. The read control circuit 42 further outputs the second write line address signal indicating the address of the target memory cell 10 and the reading signal indicating the reading operation, to the second write line decoder 70. The second write line decoder 70 connects the second write line 71 (ex. 71*a*) connected to the target memory cell 10 and the second current source circuit 47. The second write line 71 (ex. 71*b*) connected to the second write line 71 (ex. 71*a*) is grounded. The read control circuit 42 further instructs the current source circuit 47 to supply the desirable first magnetization current IM1, for example, 1 mA. Thus, the first magnetization current IM1 flows through the desirable second write line 71. Then, the magnetic field. H1 is generated. The magnetization direction of the first magnetic material reference layer 62 whose magnetic anisotropy is small is set to the predetermined direction by the magnetic field H1. Correspondingly thereto, the magnetization direction of the second magnetic material reference layer 64 is set. This direction is always constant in the reading operation. The read control circuit 42 further instructs the current source circuit 43 to supply the desirable read current IR, for example, 0.1 mA. Hence, the read current IR flows through the route following the write line decoder 20, the first write line 21*a*, the upper electrode, the magneto-resistive element 1, the lower electrode, the first write line 21*b* and the ground in this order.

That is, the current flows from the upper electrode to the lower electrode. Here, when the resistance value of the magneto-resistive element 1 and the selecting transistor 9 has any value of 1 kΩ and 1.4 kΩ on the basis of the value of the stored data, the value of the potential V45 becomes any of 0.1 V and 0.14 V. The comparing circuit 44, when comparing Vref=0.12 V with the value of the potential V45, can judge the stored data.

The reading principle in the operation of the magnetic random access memory of the third exemplary embodiment of the present invention is similar to the second exemplary embodiment. Thus, its explanation is omitted.

In the exemplary embodiment, at the time of the writing operation, the write current is supplied from the second magnetic material free layer 56 to the first magnetic material reference layer 62. Then, spin electrons are transferred from the first magnetic material reference layer 62 to the first magnetic material free layer 54. That is, the transferred electrons are used to carry out the writing. However, as described in the second exemplary embodiment, it is possible to carry out the writing by supplying the current to the opposite direction; namely, it is possible to carry out the writing by reflection electrons.

Also, this exemplary embodiment can get the effect similar to the second exemplary embodiment. In addition, it is possible to perform the writing through spin transfer process, even on the magneto-resistive element, in which the complex procedure is necessary for the applied magnetic field such as the toggle writing.

It is apparent that the present invention is not limited to the above exemplary embodiments, but may be modified and changed without departing from the scope and spirit of the invention.

As mentioned above, according to the present invention, when the writing is performed on the magneto-resistive element through the spin transfer process, the similar principle can be used to perform the writing. Thus, the write properties can be made similar, independently of the data. Hence, it is possible to provide the semiconductor storage device in which the writing circuit is simple.

According to the present invention, when the writing of the spin transfer process is carried out, the write properties become similar, independently of the magnetization direction. Thus, the similar circuit can be used to carry out the writing, and the similar method can be used to carry out the writing.

The invention claimed is:

1. A magnetic random access memory of a spin transfer process, said magnetic random access memory comprising:
   a plurality of magnetic memory cells;
   a current supply unit which selects a target memory cell to which data is written from said plurality of magnetic memory cells, and supplies a write current to said target memory cell; and
   a control unit which controls a supply of said write current supplied by said current supply unit on a basis of a write data,
   wherein each of said plurality of magnetic memory cells includes:
      a magnetic material storage layer which stores the data by using a magnetization state; and
      at least one spin control layer which supplies spin electrons to said magnetic material storage layer on a basis of a same control principle independently of said write data, on a basis of said write current,
   wherein said magnetic material storage layer comprises:
      a first magnetic material layer; and
      a second magnetic material layer which is antiferromagnetically-coupled with said first magnetic material layer through a non-magnetic conductor layer,
   wherein said at least one spin control layer comprises:
      a first spin control layer; and
      a second spin control layer,
   wherein said first spin control layer comprises:
      a first magnetic material pinned layer whose magnetization direction is pinned and which is coupled with said first magnetic material layer through a first non-magnetic material layer,
   wherein said second spin control layer comprises:
      a second magnetic material pinned layer whose magnetization direction is pinned and which is coupled with said second magnetic material layer through a second non-magnetic material layer,
   wherein said magnetization directions of said first magnetic material pinned layer and said second magnetic material pinned layer are approximately coincident,
   wherein said control unit controls said current supply unit so that said write current is supplied from any one of said first magnetic material pinned layer and said second magnetic material pinned layer to the other one, on the basis of said write data,
   wherein a resistance value between said first magnetic material pinned layer and said first magnetic material layer is different from a resistance value between said second magnetic material pinned layer and said second magnetic material layer, and
   wherein the data is rewritten by using both of principles of a spin electron transfer from one pinned layer and a spin electron selection pass through an other pinned layer at one time, said one pinned comprising one of said first and second magnetic material pinned layers, and the other pinned layer comprising an other of said first and second magnetic material pinned layers.

2. The magnetic random access memory according to claim 1, wherein said at least one of said first magnetic material pinned layer and said second magnetic material pinned layer includes:
   a third magnetic material layer; and
   a fourth magnetic material layer which is antiferromagnetically-coupled with said third magnetic material layer through a non-magnetic conductor.

3. The magnetic random access memory according to claim 1, wherein said spin control layer is shaped such that a section vertical to a direction through which said write current flows is externally configured by any of convex curves and straight line.

4. The magnetic random access memory according to claim 3, wherein a shape of said spin control layer is one of a circle, a square and a shape similar to any one of a circle and a square.

5. A magnetic random access memory of a spin transfer process, said magnetic random access memory comprising:
   a plurality of magnetic memory cells;
   a current supply unit which selects a target memory cell to which a data is written from said plurality of magnetic memory cells, and supplies a write current to said target memory cell; and
   a control unit which controls a supply of said write current supplied by said current supply unit on a basis of a write data,
   wherein each of said plurality of magnetic memory cells comprises:
      a magnetic material storage layer which stores a data by using a magnetization state; and
      at least one spin control layer which supplies spin electrons to said magnetic material storage layer on a basis of a same control principle independently of said write data, on a basis of said write current, wherein said at least one spin control layer is one,
wherein said control unit controls states of spin electrons in said spin control layer, on a basis of said write data,
wherein said magnetic material storage layer includes:
 a first magnetic material layer, and
 a second magnetic material layer which is antiferromagnetically-coupled with said first magnetic material layer through a non-magnetic conductor layer,
wherein said spin control layer includes:
 a first magnetic material reference layer which is coupled with said first magnetic material layer through a first non-magnetic material layer,
wherein said control unit changes a magnetization direction of said first magnetic material reference layer on the basis of said write data, and controls said current supply unit so that said write current is supplied from any one of said first magnetic material reference layer and said second magnetic material layer to the other one in a predetermined direction,
wherein said spin control layer further comprises:
 a second magnetic material reference layer that is antiferromagnetically-coupled with said first magnetic material reference layer through a second non-magnetic material layer, between said first non-magnetic material layer and said first magnetic material reference layer,
wherein said control unit, while continuously changing said magnetization direction of said first magnetic material reference layer with a temporal elapse, controls said current supply unit so that said write current is supplied from any one of said first magnetic material reference layer and said second magnetic material layer to the other one in a predetermined direction, on the basis of said write data,
wherein said control unit comprises:
 a first wiring which extends near said target memory cell to control said magnetization direction of said first magnetic material reference layer on the basis of said write data; and
 a second wiring which is perpendicular to said first wiring and extends near said target memory cell to control said magnetization direction of said first magnetic material reference layer on the basis of said write data.

6. An operating method of a magnetic random access memory of a spin transfer process, wherein said magnetic random access memory includes:
 a plurality of magnetic memory cells;
 a current supply unit; and
 a control unit,
wherein each of said plurality of magnetic memory cells includes:
 a magnetic material storage layer which stores data by using a magnetization state; and
 at least one spin control layer,
wherein said magnetic material storage layer comprises:
 a first magnetic material layer; and
 a second magnetic material layer which is antiferromagnetically-coupled with the first magnetic material layer through a non-magnetic conductor layer,
wherein said at least one spin control layer comprises:
 a first spin control layer; and
 a second spin control layer,
wherein said first spin control layer comprises:
 a first magnetic material pinned layer whose magnetization direction is pinned and which is coupled with said first magnetic material layer through a first non-magnetic material layer,
wherein said second spin control layer comprises:
 a second magnetic material pinned layer whose magnetization direction is pinned and which is coupled with said second magnetic material layer through a second non-magnetic material layer,
wherein said magnetization directions of said first magnetic material pinned layer and said second magnetic material pinned layer are substantially coincident,
wherein a resistance value between said first magnetic material pinned layer and said first magnetic material layer is different from a resistance value between said second magnetic material pinned layer and said second magnetic material layer,
wherein said operating method of said magnetic random access memory comprises:
 said current supply unit selecting a target memory cell to which the data is written from said plurality of magnetic memory cells;
 said control unit controlling said current supply unit on a basis of said write data such that said current supply unit supplies a write current to said target memory cell; and
 said at least one spin control layer supplying spin electrons to said magnetic material storage layer on a basis of said same control principle, independently of said write data, on a basis of said write current,
wherein said controlling said current supply unit comprises:
 said control unit controlling said current supply unit such that said write current is supplied from any one of said first magnetic material pinned layer and said second magnetic material pinned layer to the other one, on the basis of said write data, and
wherein the data is rewritten by using both of principles of a spin electron transfer from one a spin electron selection pass through an other pinned layer at one time, said one pinned layer comprising one of said first and second magnetic material pinned layers, and the other pinned layer comprising an other of said first and second magnetic material pinned layers.

7. The operating method of said magnetic random access memory according to claim 6, wherein said at least one of said first magnetic material pinned layer and said second magnetic material pinned layer includes:
 a third magnetic material layer; and
 a fourth magnetic material layer which is antiferromagnetically-coupled with said third magnetic material layer through a non-magnetic conductor.

8. The operating method of said magnetic random access memory according to claim 6, wherein said spin control layer is shaped such that a section vertical to a direction through which said write current flows is externally configured by any of convex curves and straight lines.

9. The operating method of said magnetic random access memory according to claim 8, wherein a shape of said spin control layer is one of a circle, a square and a shape similar to any one of a circle and a square.

10. An operating method of said magnetic random access memory of a spin transfer process, wherein said magnetic random access memory comprises:
 a plurality of magnetic memory cells;
 a current supply unit; and
 a control unit,
wherein each of said plurality of magnetic memory cells comprises:
 a magnetic material storage layer which stores a data by using a magnetization state; and
 at least one spin control layer, wherein said at least one spin control layer is one,
wherein said magnetic material storage layer includes:
- a first magnetic material layer; and
- a second magnetic material layer which is antiferromagnetically-coupled with said first magnetic material layer through a non-magnetic conductor layer, wherein said spin control layer includes:
- a first magnetic material reference layer which is coupled with said first magnetic material layer through a first non-magnetic material layer, wherein said spin control layer further comprises:
- a second magnetic material reference layer which is antiferromagnetically-coupled with said first magnetic material reference layer through a second non-magnetic material layer, between said first non-magnetic material layer and said first magnetic material reference layer, wherein said control unit comprises:
- a first wiring which extends near said target memory cell to control said magnetization direction of said first magnetic material reference layer on a basis of said write data; and
- a second wiring which is perpendicular to said first wiring and extends near said target memory cell to control said magnetization direction of said first magnetic material reference layer on the basis of said write data, wherein said operating method of said magnetic random access memory comprises:
- said current supply unit selecting a target memory cell to which, a data is written from said plurality of magnetic memory cells;
- said control unit controlling said current supply unit on the basis of said write data such that said current supply unit supplies a write current to said target memory cell; and
- said at least one spin control layer supplying spin electrons to said magnetic material storage layer on a basis of said same control principle, independently of said write data, on a basis of said write current, wherein said controlling said current supply unit comprises:
- said control unit controlling states of spin electrons in said spin control layer, on the basis of said write data, wherein said control unit controlling states of spin electrons includes:
- said control unit changing a magnetization direction of said first magnetic material reference layer on the basis of said write data, and controlling said current supply unit so that said write current is supplied from any one of said first magnetic material reference layer and said second magnetic material layer to the other one in a predetermined direction;
- said control unit while continuously changing said magnetization direction of said first magnetic material reference layer with a temporal elapse, controlling said current supply unit so that said write current is supplied from any one of said first magnetic material reference layer and said second magnetic material layer to the other one in a predetermined direction, on the basis of said write data; and
- said control unit controlling said magnetization direction of said first magnetic material reference layer by using a magnetic field generated by a current flowing through said first wiring and said second wiring.

* * * * *